United States Patent
Steigerwald et al.

(10) Patent No.: US 11,079,673 B2
(45) Date of Patent: Aug. 3, 2021

(54) METHOD AND APPARATUS FOR REPAIRING DEFECTS OF A PHOTOLITHOGRAPHIC MASK FOR THE EUV RANGE

(71) Applicant: Carl Zeiss SMT GmbH, Oberkochen (DE)

(72) Inventors: Hendrik Steigerwald, Urmitz (DE); Renzo Capelli, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 302 days.

(21) Appl. No.: 15/941,709

(22) Filed: Mar. 30, 2018

(65) Prior Publication Data

US 2018/0284600 A1 Oct. 4, 2018

(30) Foreign Application Priority Data

Apr. 3, 2017 (DE) .......................... 102017205629.0

(51) Int. Cl.
*G03F 1/72* (2012.01)
*G06F 30/39* (2020.01)
*G03F 1/24* (2012.01)
*G03F 1/52* (2012.01)

(52) U.S. Cl.
CPC .................. *G03F 1/72* (2013.01); *G03F 1/24* (2013.01); *G03F 1/52* (2013.01); *G06F 30/39* (2020.01)

(58) Field of Classification Search
CPC ................. G03F 1/72; G03F 1/24; G03F 1/52
See application file for complete search history.

(56) References Cited

U.S. PATENT DOCUMENTS

| | | |
|---|---|---|
| 7,459,242 B2 | 12/2008 | Zait et al. |
| 8,142,958 B2 | 3/2012 | Holfeld |
| 2014/0072903 A1 | 3/2014 | Satake et al. |
| 2014/0165236 A1 | 6/2014 | Budach et al. |
| 2014/0255831 A1 | 9/2014 | Hofmann et al. |
| 2017/0176851 A1 | 6/2017 | Peters et al. |

FOREIGN PATENT DOCUMENTS

| | | | |
|---|---|---|---|
| DE | 102007028172 | 12/2008 | ............... G03F 1/08 |
| DE | 102011079382 | 1/2013 | ............... G03F 1/72 |
| DE | 102013203995 | 9/2014 | ........... H01L 21/027 |
| EP | 1 829 052 | 4/2008 | ............... G21K 1/06 |
| WO | WO 2011/161243 | 12/2011 | ............... G03F 1/14 |
| WO | WO 2013/010976 | 1/2013 | ............... G03F 1/22 |

(Continued)

OTHER PUBLICATIONS

McIntyre et al., "Through-focus EUV multilayer defect repair with nanomachining", *Proc. of SPIE, Extreme Ultraviolet (EUV) Lithography IV*, vol. 8679, pp. 86791I-1-86791I-4, (2013).

(Continued)

*Primary Examiner* — Daborah Chacko-Davis
(74) *Attorney, Agent, or Firm* — Fish & Richardson P.C.

(57) ABSTRACT

The invention relates to a method and an apparatus for repairing at least one defect of a photolithographic mask for the extreme ultraviolet (EUV) wavelength range, wherein the method includes the steps of: (a) determining the at least one defect; and (b) ascertaining a repair shape for the at least one defect; (c) wherein the repair shape is diffraction-based in order to take account of a phase disturbance by the at least one defect.

30 Claims, 15 Drawing Sheets

(56) References Cited

FOREIGN PATENT DOCUMENTS

| WO | WO 2015/144700 | 10/2015 | |
|----|----------------|---------|----|
| WO | WO 2016/037851 | 3/2016 | ............... G03F 1/24 |

OTHER PUBLICATIONS

Pang et al., "Compensation for EUV multilayer defects within arbitrary layouts by absorber pattern modification", *Proc. of SPIE, Extreme Ultraviolet (EUV) Lithography II*, vol. 7969, pp. 79691E-1-79691E-14 (2011).

Pang et al., "EUV multilayer defect compensation (MDC) by absorber pattern modification—From theory to wafer validation", *Proc. of SPIE, Photomask Technology 2011*, vol. 8166, pp. 81662E-1-81662E-15 (2011).

Waiblinger et al., "The door opener for EUV mask repair", *Proc. of SPIE, Photomask and Next Generation Lithography Mask Technology XIX*, vol. 8441, pp. 84410F1-84410E-10, (2012).

German Office Action for German Application No. 10 2017 205 629.0 dated Nov. 27, 2017.

German Office Action for German Application No. DE 10 2017 205 629.0, dated Sep. 10, 2020.

"25 years ZEISS AIMS technology", ZEISS (2018).

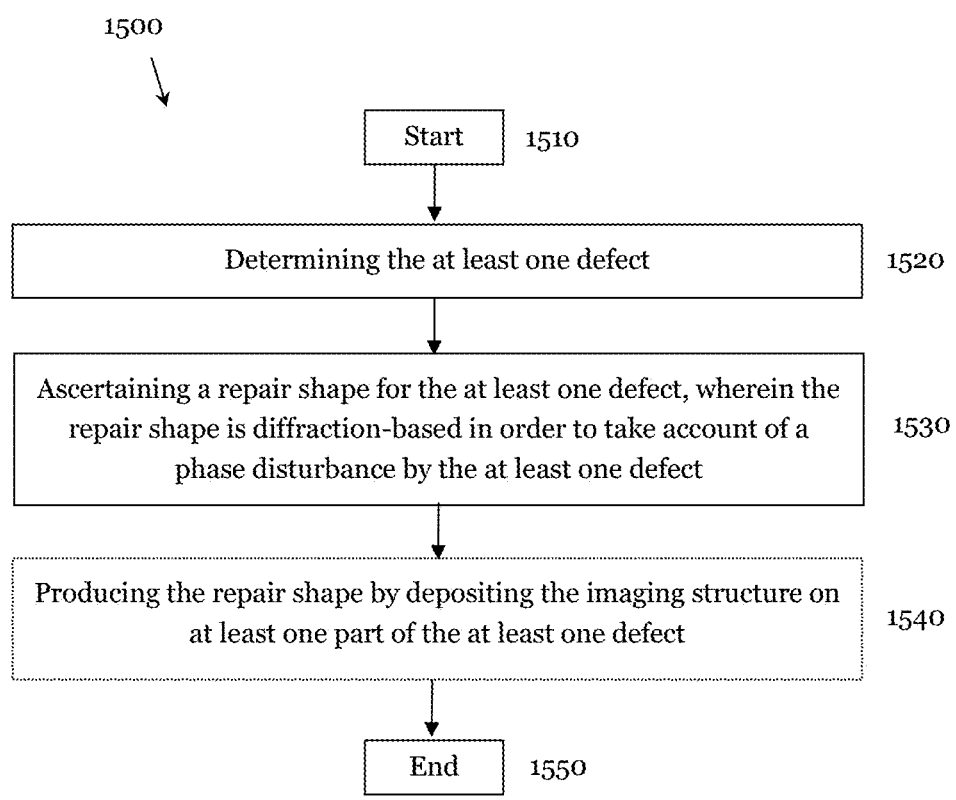

METHOD AND APPARATUS FOR REPAIRING DEFECTS OF A PHOTOLITHOGRAPHIC MASK FOR THE EUV RANGE

CROSS REFERENCE TO RELATED APPLICATION

This patent application claims priority to and benefit of the German patent application DE 10 2017 205 629.0, entitled "Verfahren and Vorrichtung zum Reparieren von Defekten einer photolithographischen Maske für den EUV-Bereich," filed with the German Patent and Trademark Office on Apr. 3, 2017, the entire content of which is incorporated herein by reference.

TECHNICAL FIELD

The present invention relates to repairing defects of a photolithographic mask for the extreme ultraviolet (EUV) range.

BACKGROUND

As a consequence of the growing integration density in the semiconductor industry, photolithography masks have to image increasingly smaller structures on wafers. In order to take account of this trend, the exposure wavelength of lithography apparatuses is being shifted to ever shorter wavelengths. Future lithography systems will probably operate with wavelengths in the extreme ultraviolet (EUV) range (preferably, but not necessarily, in the range of 6 nm to 15 nm). The EUV wave-length range places huge demands on the precision of optical elements in the beam path of future lithography systems. The optical elements, and hence also the photo-lithographic masks, will most likely be reflective optical elements, since the real part of the refractive index of the currently known materials is substantially equal to one in the EUV range.

EUV mirrors comprise a substrate exhibiting little thermal expansion. A multilayer structure comprising, for example, approximately 20 to approximately 60 double layers comprising silicon (Si) and molybdenum (Mo), or other suitable materials, is applied to the substrate, said layers acting as a dielectric mirror. The European patent document EP 1 829 052 B1 discloses a possible exemplary embodiment of such a reflective multilayer system for the EUV wavelength range.

EUV photolithography masks, or simply EUV masks, additionally have an absorber structure or an absorber pattern on the multilayer structure. In the regions of the EUV mask covered by elements of the absorber structure, incident EUV photons are absorbed or at least not reflected like in the other regions.

EUV masks—or, in general, photomasks—are projection templates, the most important application of which is photolithography for producing semiconductor components, in particular integrated circuits. Photomasks must be largely error-free, since an error of the mask would reproduce on each wafer during each exposure. Therefore, the highest demands in respect of planar qualities, cleanliness, temperature stability, reflection constancy and freedom of errors are placed on the materials of the optical elements for the EUV range, in particular the photomasks.

In the case of a photomask, it is important that the elements of the absorber pattern on the photomask exactly image the structure elements predetermined by the design of the semiconductor element into the photoresist on the wafer. The intended dimension of the structure elements produced in the photoresist by the absorber pattern is referred to as a critical dimension (CD). This variable, or the variation thereof, is an essential characteristic for the quality of a photomask. Freedom of errors for photomasks means that, in this context, the mask upon exposure with the actinic wavelength images an intended dimension within a predetermined error interval onto a wafer, i.e. the CD may only vary within the predetermined error interval. If this condition is satisfied, the photomask has no visible defects or print-able defects on a wafer.

Currently, it is not possible to produce substrates and/or multilayer structures for photomasks for the EUV wavelength range which are free from printable defects or errors. The defects considered in this application have their origin in small local unevennesses of the mask substrate (<10 nm deviation from a predetermined thickness), which may propagate through the multilayer structure. Further, local defects within the multilayer structure or particles on the substrate or within the multilayer structure are the cause of impairments of the function of the multilayer structure as a mirror. Below, these defects are referred to as buried defects or defects of the multilayer structure—as is conventional in the art. Currently, there are various concepts for avoiding or at least attenuating the effect of printable defects of EUV masks, which are caused by defects in the multilayer structure.

Thus, after the examination of the defects of a mask blank, i.e. a substrate with an applied multilayer structure, the absorber pattern can be arranged on the mask blank in such a way that the elements of the absorber pattern substantially cover the printable defects. The article "EUV multilayer defect compensation (MDC) by absorber pattern modification—From theory to wafer validation" by L. Peng, P. Hu, M. Satake, V. Tolani, D. Peng, Y Li and D. Chen, in "Photomask Technology 2011", edited by W. Maurer, F. E. Abboud, Proc. of SPIE, Vol. 8166, 81662E-1-81662E-15, describes a simulation tool, with the aid of which the best possible arrangement of an absorber pattern on a defect-afflicted mask blank can be determined very quickly.

An important consequence of printable defects of a mask blank is a local reduction in the optical intensity in the aerial image produced by the photomask. As a result, the images of the elements of the absorber pattern surrounding the defect are disturbed in the case of photomasks. In order to reduce the effects of a defect of a mask blank on an absorber pattern of a photolithographic mask, a part of the elements of the absorber pattern around a printable defect is locally removed. As a result, the optical intensity in the region of the defect is increased or at least partly re-established. This so-called compensational repair is explained, for example, in the publication "Compensation for EUV multilayer defects within arbitrary layouts by absorber pattern modification" by L. Pang, C. Clifford, D. Peng, Y Li, D. Chen, M. Satake, V. Tolani and L. He, in "Extreme Ultraviolet Lithography", edited by B. M. La Fontaine, P. P. Naulleau, Proc. of SPIE, Vol. 7969, 79691E-1-79691E-14. The modifications of the absorber pattern for compensating local pits or bumps of a mask blank, which are required for defect compensation, are determined with the aid of a simulation tool.

WO 2016/037851 describes the subdivision of defects of mask blanks into two classes, wherein the defects of the first class are covered by elements of the absorber pattern and the defects of the second class are removed by the above-described compensational repair.

The article "The door opener for EUV mask repair" by M. Waiblinger, R. Jonck-heere, T. Bret, D. van den Heuvel, C. Baur and G Baralia, in "Photomask and Next Generation Lithography Mask Technology XIX", edited by K. Kato, Proc. of SPIE, Vol. 84441, 84410F1-84410E-10, 2012, describes the repair of both defects of the absorber pattern and also of the multilayer structure of EUV masks, wherein the last-mentioned defects are compensated with the aid of the compensational repair technique.

Further, WO 2011/161243 describes the compensation of defects of EUV masks by producing local changes in the multilayer structure of an EUV mask with the aid of an electron beam.

Moreover, WO 2013/010976 describes the correction of buried defects of EUV masks, wherein the defects are localized by the combined use of an ultraviolet radiation source, a scanning probe microscope and a scanning particle microscope.

Moreover, a further method uses ultrashort laser pulses for local compression of the substrate material of a photomask or mask blank for the purposes of compensating defects of EUV masks. WO 2015/144700 describes the introduction of pixels into a substrate of an EUV mask through the rear side of the substrate, i.e. the side of the mask substrate which lies opposite the multilayer structure.

Finally, in the article "Through-focus EUV multilayer defect repair with nanomachining", in "Extreme Ultraviolet (EUV) Lithography IV", edited by P. P. Naulleau, Proc. of SPIE, Vol. 8679, 86791I-1-86791I-4, G McIntyre, E. Gallagher, T. Robinson, A. C. Smith, M. Lawliss, J. LeClaire, R. Bozak, R. White and M. Archuletta describe that, by way of compensation of the phase disturbances of the multilayer structure induced by local bumps or pits by use of a local removal of part of the defect (in the case of a local bump) or a local deposition of the material on the defect present in the form of a local pit, it is possible to compensate the phase error of these defects.

Despite the multiplicity of employed defect correction methods, buried defects or defects of the multilayer structure often still cannot be repaired with the required quality. Defects of the multilayer structure currently represent a main obstacle for the use of EUV wavelengths in photolithography.

Therefore, the present invention addresses the problem of specifying a method and an apparatus which improve the repair of defects of a photolithographic mask for the extreme ultraviolet wavelength range.

SUMMARY

According to one aspect of the present invention, this problem is solved by a method for repairing at least one defect of a photolithographic mask for the extreme ultraviolet (EUV) wavelength range, the method including the steps of: (a) determining the at least one defect; and (b) ascertaining a repair shape for the at least one defect; (c) wherein the repair shape is diffraction-based in order to take account of a phase disturbance by the at least one defect.

By virtue of the repair shape exploiting the principle of optical diffraction, it opens up, within the scope of the defect correction of EUV masks, new possibilities in terms of the precision with which defects of the multilayer structure of EUV masks can be corrected. The repair shape can be individually adapted to the form of the determined defect. As a result, it is possible to achieve a best-possible correction of defects of the multilayer structure of EUV photomasks. Using a method according to the invention, it is possible to repair both absorbing and phase-shifting EUV masks. Moreover, it is a particular advantage of a defect repair according to the invention that the multilayer mirror structure containing the defect is not modified during the repair process. Therefore, a failed repair of a defect can easily be corrected.

Determining the at least one defect may comprise at least one of the following steps: analyzing the at least one defect with a scanning probe microscope, analyzing the at least one defect with a particle beam, producing an aerial image of the at least one defect at an actinic wavelength of the photolithographic mask, producing aerial images of a focus stack of the at least one defect at the actinic wavelength of the photolithographic mask, and exposing a wafer with the photolithographic mask.

A particle beam may comprise an electron beam, an ion beam, an atomic beam, a molecular beam and/or a photon beam.

Ascertaining the repair shape may comprise: reconstructing the phase disturbance of the at least one defect from the focus stack of aerial images of the at least one defect.

In the case of defects that are difficult to detect, the combined use of two or more metrology tools may be expedient. By way of example, it is possible to use a scanning probe microscope to analyze the surface contour of a defect of a multilayer structure and to use an AIMS™ (Aerial Image Metrology System) to examine the course of the defect within the multilayer structure and hence the phase change or phase disturbance caused thereby within the multilayer structure. By way of example, the type of defect of the multilayer structure of an EUV mask is exposed by measuring the width of a line to be imaged when tuning the focus of an AIMS™ or of an exposure system from underfocusing to over-focusing.

Ascertaining the repair shape may comprise: determining an imaging structure for a deposition on at least part of the at least one defect, wherein the imaging structure has at least one first region that is transparent to electromagnetic radiation at an actinic wavelength and at least one second region that changes a phase of the electromagnetic radiation at the actinic wavelength and/or at least partly absorbs the electromagnetic radiation of the actinic wavelength.

A defect of a multilayer structure of an EUV mask act like a lens element which redistributes the reflected radiation by a deflection from the predetermined reflection direction and, as a result thereof, typically disturbs both the phase and the amplitude of the electromagnetic radiation that is reflected in the region of the defect. A repair shape of the method defined here comprises an imaging structure which substantially compensates the lens effect of the defect and hence cancels the effect thereof. The imaging structure can be considered to be a hologram of a point at a finite distance, it being possible to record said hologram by a superposition of a spherical wave and a spherical wave or a plane wave as a reference wave in a light-sensitive layer (see Bergmann Schäfer: "Optik", Chapter 10.2.4, 10th edition, de Gruyter). This forms the basis for a calculation of the first and the second elements of an imaging structure.

The combined effect of the imaging structure and the defect ensures that the region of the defect reflects the radiation incident at the actinic wavelength in the same way as a region of the multilayer structure which has no defect. The construction or the design of the imaging structure takes account of the fact that the electromagnetic radiation at the actinic wavelength passes twice through the imaging structure. Further, the design of the imaging structure takes account of the fact that the electromagnetic radiation is incident on the multilayer structure of an EUV mask at an angle (preferably 6° to 8°) in relation to the perpendicular. If part of a defect of the multilayer structure is covered by an element of the absorber structure or of the absorber pattern, then this is likewise included in the calculation when designing the imaging structure. Alternatively, a part of the absorber pattern can be modified in order to be able to better repair the defect of the multilayer structure. In particular, part of the absorber pattern can be removed.

Here, and at other places in the description, too, the expression "substantially" denotes the indication of a variable within its metrological limits when using measurement instruments according to the prior art.

Determining the imaging structure may comprise: determining the at least one first region and the at least one second region such that a phase of an electromagnetic wave at the actinic wavelength, which is incident on the imaging structure, substantially has no phase disturbance after the reflection thereof by the defective region of a multilayer mirror structure, and after a renewed passage through the imaging structure, in comparison with an electromagnetic wave that is reflected by a defect-free region of the multilayer structure.

Designing the imaging structure for an individual defect, which has a detected surface contour, is typically effectuated with the aid of a computer system. Here, it is possible to individually match the outlay of the defect repair to each defect.

Ascertaining the repair shape may further comprise the step of: determining a focal length of the imaging structure from a radius of curvature of a surface contour of the at least one defect.

The surface contour of a defect of a multilayer structure of an EUV mask can vary greatly. Thus, for example, defects in the form of a local bump can be extensive in the lateral direction or tend to be delimited locally. The height of a defect of the multilayer structure can range from zero or close to zero up to the two-digit nanometer range. By determining an individually adapted repair shape, it is possible to repair all these defects.

It is possible to select a material for which $\beta/\delta<1$, preferably $<0.7$, more preferably $<0.5$, and most preferably $<0.3$ applies at the actinic wavelength for the imaging structure, where $\delta$ denotes the deviation of the real part of the complex refractive index from 1 and $\beta$ denotes the imaginary part of the complex refractive index of the material of the imaging structure.

In principle, an imaging structure can be embodied in two extreme manifestations. The material for the at least one second region can, firstly, be selected to be transparent at the actinic wavelength or can, secondly, be selected with maximum absorbance at the actinic wavelength. The use of an imaging structure which is based completely, or at least predominantly, on a phase shift of the at least one second element is advantageous in that the imaging structure does not add even further amplitude losses, caused by the imaging structure, to the amplitude disturbances of the defect. However, no materials that are transparent at wavelengths in the EUV range are currently known. In the imaging structures discussed within the scope of this application, the at least one second region causes a non-negligible absorption of the incident radiation. Nevertheless, it is expedient to select a material for the at least one second region of the imaging structure, the absorption of said material at the actinic wavelength being low in comparison with other suitable materials.

The method for correcting phase errors of reflecting photomasks defined here can be used, in general, for compensating transmissive optical elements that have local phase disturbances. To this end, a material that is transparent at the wavelength at which the optical element operates is selected and the imaging structure substantially has a phase shift. When designing the imaging structure, it should be noted that the optical radiation only passes through the imaging structure once.

The imaging structure may comprise a Fresnel zone plate.

Fresnel zone plates are ring gratings which, like optical gratings in general, exploit the principle of optical diffraction. Fresnel zone plates, or simply zone plates, alternate between zones that are transparent to light and zones that shift the phase of light by 180° and/or absorb light. The width of a zone is selected such that light which passes through the zone plate and which is deflected to a point has a phase difference $\leq 180°$. In an amplitude zone plate, either the even orders of diffraction (i.e. the 2nd, 4th, 6th, etc. order of diffraction) or the odd orders of diffraction (i.e. the 1st, 3rd, 5th, etc. order of diffraction) are absorbed in the corresponding zones of the zone plate. In phase zone plates, the optical radiation in the corresponding zones experiences a phase shift through 180° or $\pi$ and interferes constructively in the focus of this zone plate with the orders of diffraction, shifted by $\pi$ in phase, of the other zones. If the focus of a zone plate lies on the optical axis, the Fresnel zone plate has a concentric ring structure, with the spacing of the zones reducing with increasing distance from the optical axis.

The Fresnel zone plate may comprise at least four zones, preferably at least six zones, more preferably at least eight zones and most preferably at least ten zones.

The imaging quality of a Fresnel zone plate increases with increasing number of zones. On the other hand, the outlay for ascertaining the corresponding repair shape and, in particular, the outlay for depositing the zone plate onto a defect increase with an increasing zone number.

Ascertaining the repair shape may further comprise: determining a change of part of an absorber pattern that is adjacent to the at least one defect for the purposes of at least partly correcting the amplitude disturbance caused by the at least one defect. Ascertaining the repair shape may further comprise: taking account of the amplitude change produced by the repair shape when determining the change of the part of the absorber pattern. The change of part of the absorber pattern may comprise a removal of part of the absorber pattern that is adjacent to the at least one defect.

By virtue of a repair shape correcting a phase disturbance of a defect with the aid of an imaging structure that is matched individually to the defect and removing an amplitude disturbance of the defect by a matched compensational correction, the repair described in this application facilitates a comprehensive compensation of the defects in the multilayer structure. After the defect correction, the focal region that can be used by an exposure system is substantially unrestricted. The effect of the imaging structure on the amplitude disturbance of the defect is taken into account when ascertaining the change of the absorber pattern in the vicinity of the defect.

The repair shape can comprise the imaging structure and a change of part of the absorber pattern. The change of part of the absorber pattern may comprise the removal of part of the absorber pattern that is adjacent to the at least one defect.

For the purposes of repairing the phase component of a defect of the multilayer structure, the repair shape comprises an imaging structure that is based on the principle of optical diffraction. In order also to repair the amplitude component or the amplitude disturbance of defects in addition to the phase component thereof, the repair shape comprises a compensational correction of the amplitude disturbance of these defects. When ascertaining the compensational correction, it is expedient also to take into account the amplitude change of the radiation reflected in the region of the defect caused by the repair shape or by the imaging structure of the repair shape.

Ascertaining the repair shape may further include the step of: simulating the removal of part of the absorber pattern, which is adjacent to the at least one defect, before ascertaining the repair shape.

In order to ascertain an ideal repair shape, it may be expedient to remove part of the absorber pattern that is adjacent to the defect prior to the defect repair. Removing part of the absorber pattern opens up a new degree of freedom during the defect repair. Then, an imaging structure and a change of the new absorber pattern are ascertained on the basis of the new, modified absorber pattern, said imaging structure and the change together forming the repair shape and repairing the defect to the best possible extent.

The repair shape can comprise an imaging structure and the change of the absorber pattern, wherein the change includes removing part of the absorber pattern or the change includes depositing part of the absorber pattern.

As explained above, a repair process may comprise, in a first step, the removal of part of the absorber pattern that is adjacent to the defect to be repaired. In this case, the associated repair shape comprises three points: an imaging structure, a removal of part of the absorber pattern and a deposition of a new part of the absorber pattern on at least one part of the multilayer structure, from which the original absorber pattern was removed previously.

The method for repairing at least one defect of a photolithographic mask for the extreme ultraviolet wavelength range may further include the step of: producing a repair shape by depositing the imaging structure on at least one part of the at least one defect by use of a first particle beam and a first deposition gas.

If no part of the defect is covered by the absorber pattern, it is preferable to apply the imaging structure substantially centrally on the defect. However, if part of the defect of the multilayer structure is covered by the absorber pattern, the imaging structure is designed in such a way that it corrects the non-covered and hence effective part of the defect. Alternatively, it is possible, before the repair shape is ascertained, to remove the part of the absorber pattern that shadows the defect of the multilayer structure. This may initially be effectuated in the simulation prior to ascertaining the repair shape such that the repair shape for the best-possible repair of the defect can be determined. Before attaching the ascertained repair shape onto the defect, the part of the absorber pattern removed in the simulation is then in fact removed.

The first particle beam may comprise an electron beam and/or the first deposition gas may comprise a metal carbonyl. The metal carbonyl may comprise a molybdenum carbonyl. Further, the deposition gas may comprise a niobium precursor gas.

It is possible to gather the optical properties of the various elements of the periodic table, which come into question for attaching the repair shape onto a defect of a multilayer structure of an EUV mask, from tables (e.g.: http://henke.l-bl.gov.optical.constants/).

The method for repairing at least one defect of a photolithographic mask for the extreme ultraviolet wavelength range may further include the step of: removing part of the absorber pattern adjacent to the at least one defect by use of a second particle beam and an etching gas. The second particle beam may comprise an electron beam and the etching gas may comprise xenon difluoride ($XeF_2$).

The method for repairing at least one defect of a photolithographic mask for the extreme ultraviolet wavelength range may further include the step of: depositing part of the absorber pattern by use of the second particle beam and a second deposition gas. The second deposition gas may comprise a metal carbonyl, such as a tantalum carbonyl.

As explained above, a repair process for the defect may comprise the removal of part of the absorber pattern. For the purposes of correcting an amplitude disturbance of the defect, a subsequent application of part of the removed absorber structure may be expedient. In an alternative embodiment, ascertaining a repair shape for a defect comprises simultaneous determination of an imaging structure and a possibly necessary change in part of the absorber pattern.

A computer program may include instructions which, when executed by a computer system, prompt the computer system to carry out the method steps of one of the above-described aspects.

According to a further aspect, the problem of the present invention is solved by an apparatus for repairing at least one defect of a photolithographic mask for the extreme ultraviolet (EUV) wavelength range, in which the apparatus has: (a) means for determining the at least one defect; (b) means for ascertaining a repair shape for the at least one defect, wherein the repair shape is diffraction-based in order to take account of a phase disturbance by the at least one defect; and (c) means for producing a repair shape by depositing an imaging structure on at least one part of the at least one defect.

The means for determining the at least one defect may comprise a measurement instrument from the group of: a scanning probe microscope, a scanning particle microscope, a laser system, an AIMS' (Aerial Image Metrology System) and a photolithographic exposure system.

Moreover, the means for producing the repair shape may comprise means for providing a first particle beam and for providing a first deposition gas.

Finally, the apparatus for repairing at least one defect of a photolithographic mask for the EUV wavelength range may further have: means for changing part of an absorber pattern, wherein the means for changing part of the absorber pattern comprises: means for providing a second particle beam, a second deposition gas and an etching gas.

DESCRIPTION OF DRAWINGS

The following detailed description describes currently preferred exemplary embodiments of the invention, with reference being made to the drawings, in which:

FIG. 15 specifies a flowchart of a method for repairing a defect of an EUV mask.

DETAILED DESCRIPTION

Currently preferred embodiments of a method according to the invention and an apparatus according to the invention are explained in greater detail below on the basis of the repair of multilayer defects of absorbing photolithographic masks for the extreme ultraviolet (EUV) wavelength range. However, the method according to the invention for repairing defects of a photomask is not restricted to the examples discussed below. Instead, it can be used in the same way for repairing defects of the various types of EUV masks, in particular phase-shifting EUV masks. Moreover, the method according to the invention can be used, in general, for correcting local phase disturbances in transmissive optical elements.

Figure 1:
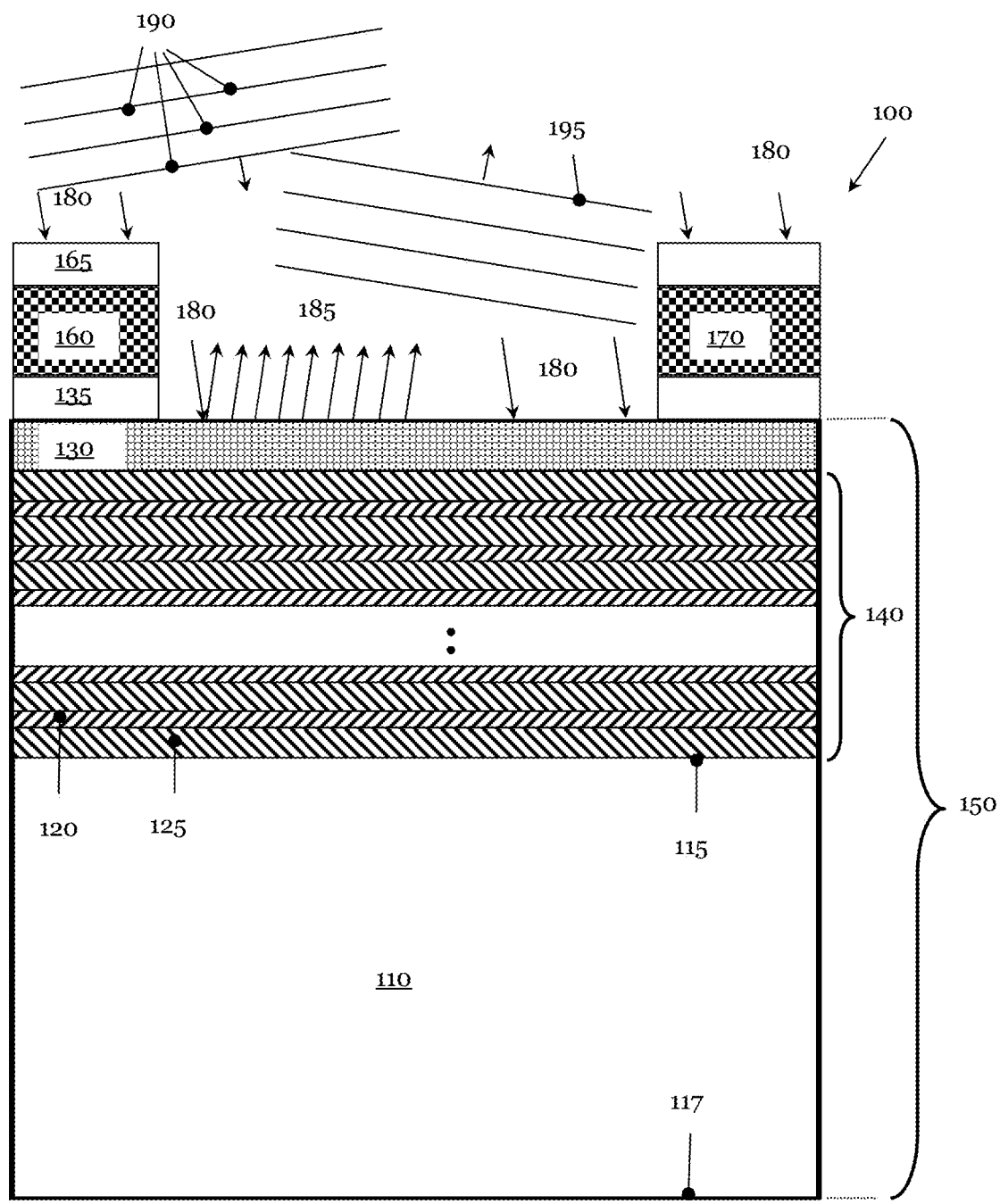
FIG. 1 schematically shows a cross section of an excerpt from a photomask for the extreme ultraviolet (EUV) wavelength range.

FIG. 1 shows a schematic section through an excerpt of an absorbing EUV mask 100 for an exposure wavelength in the region of 13.5 nm. The EUV mask 100 has a substrate 110 made of a material with a low coefficient of thermal expansion, such as quartz, for example. Other dielectrics, glass materials or semiconducting materials likewise can be used as substrates for EUV masks, such as ZERODUIR®, ULE® or CLEARCERAM®, for instance. The rear side 117 of the substrate 110 of the EUV mask 100 serves to hold the substrate 110 during the production of the EUV mask 100 and during the operation thereof. A thin electrically conductive layer for holding the substrate 110 can be applied to the rear side 117 of the substrate 110 (not shown in FIG. 1).

A multilayer film or a multilayer structure 140 comprising 20 to 80 pairs of alternating molybdenum (Mo) 125 and silicon (Si) layers 120, which are also denoted MoSi layers below, is deposited onto the front side 115 of the substrate 110. In some implementations, the thickness of each of the Mo layers 125 is, e.g., 4.15 nm and each of the Si layers 120 has a thickness of, e.g., 2.80 nm. In order to protect the multilayer structure 140, a capping layer 130 made of silicon dioxide, for example, typically having a thickness of preferably 7 nm, is applied on the topmost molybdenum layer 125. Other materials such as ruthenium (Ru), for example, can likewise be used for forming a capping layer 130. Instead of molybdenum, it is also possible to use layers composed of other elements having a high mass number, such as e.g. cobalt (Co), nickel (Ni), tungsten (W), rhenium (Re) or iridium (Ir), in the MoSi layers. The deposition of the multilayer structure 140 can be effected by ion beam deposition (IBD), for example.

The substrate 110, the multilayer structure 140 and the capping layer 130 are referred to hereinafter as mask blank 150. However, a structure having all the layers of an EUV mask, but without structuring of the whole-area absorber layer 160, may also be referred to as a mask blank.

In order to produce an EUV mask 100 from the mask blank 150, a buffer layer 135 is deposited on the capping layer 130. Possible buffer layer materials are quartz (SiO2), silicon oxygen nitride (SiON), Ru, chromium (Cr) and/or chromium nitride (CrN). An absorption layer 160 is deposited on the buffer layer 135. Materials suitable for the absorption layer 160 are, inter alia, Cr, titanium nitride (TiN) and/or tantalum nitride (TaN). An antireflection layer 165, for example composed of tantalum oxynitride (TaON), can be applied on the absorption layer 160.

The absorption layer 160 is structured for example with the aid of an electron beam or a laser beam, such that an absorber pattern 170 is generated from the whole-area absorption layer 160. The buffer layer 135 serves to protect the multilayer structure 140 during the structuring of the absorber layer 160.

The EUV photons 180 impinge on the EUV mask 100 with the phase front 190. The incident EUV photons 180 are absorbed in the regions of the absorber pattern 170 and at least the plurality of the EUV photons 180 are reflected by the multilayer structure 140 in the regions which are free from elements of the absorber pattern 170. The phase front 195 symbolizes the outgoing electromagnetic wave reflected by the multilayer structure 140.

The multilayer structure 140 should be designed in such a way that the layer thicknesses of, e.g. a molybdenum layer and a silicon layer correspond to an optical thickness of $\lambda/2$ of the actinic wavelength for the EUV photons 180 that are incident on the multilayer structure at the predetermined angle of incidence. A deviation from this condition leads to a local violation of Bragg's reflection condition and hence to a change of the locally reflected EUV radiation. On account of the very small wavelengths, the EUV range places extreme requirements on the homogeneity of the individual layers of the multilayer structure 140 and on their surface roughness over the area of the EUV mask 100. Therefore, there may be deviations in the real layer thicknesses of individual layers from a predetermined layer thickness during the production process of the multilayer structure 140 as already mentioned above. Further, a small local unevenness of the substrate 110 of the EUV mask 100 can propagate through the multilayer structure 140.

Figure 2:
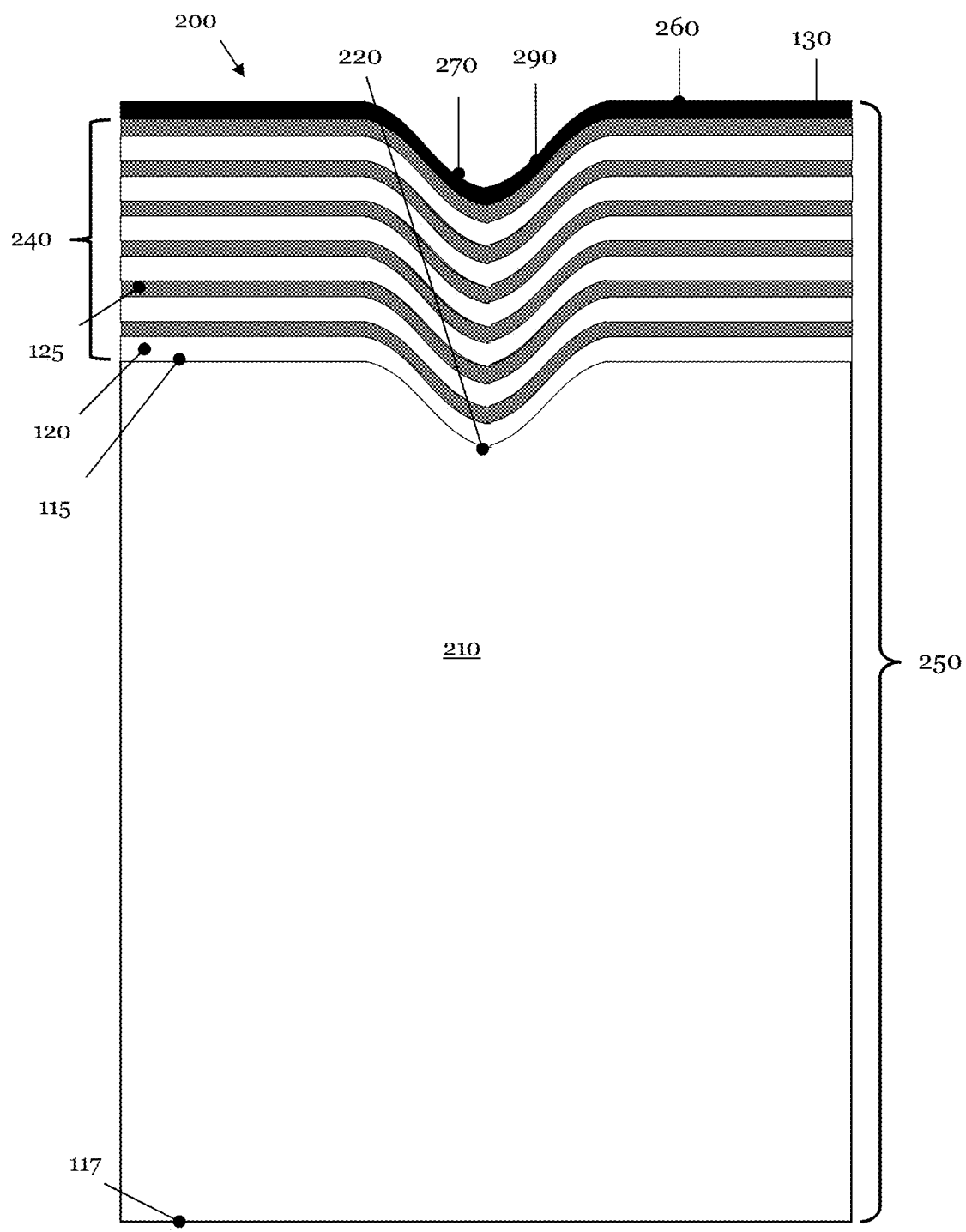
FIG. 2 schematically represents a cross section through an excerpt from a mask blank in which the substrate has a local pit.

FIG. 1 represents an ideal EUV mask 100. The diagram 200 in FIG. 2 schematically elucidates a mask blank 250 whose substrate 210 has a local defect 220 in the form of a local pit. The local pit may have arisen for example during the polishing of the front side 115 of the substrate 210. In the example elucidated in FIG. 2, the defect 220 propagates substantially in unchanged form through the multilayer structure 240. For elucidation purposes, the defects 220 and 320 are illustrated in an exaggerated fashion in terms of their height dimensions.

Furthermore, tiny scratches may arise during the polishing of the surface 115 of the substrate 210 (not illustrated in FIG. 2). As already discussed in the introductory part, during the deposition of the multilayer structure 240, particles on the surface 115 of the substrate 210 may be overgrown or particles may be incorporated into the multilayer structure 240 (likewise not shown in FIG. 2).

The defects of the mask blank 250 may have their starting point in the substrate 210, on the front side of the surface 115 of the substrate 210, in the multilayer structure 240 and/or on the surface 260 of the mask blank 250 (not shown in FIG. 2). Defects 220 that are existent on the front side 115 of the substrate 210 may—in contrast to the illustration shown in FIG. 2—change both their lateral dimensions and their height during the propagation in the multilayer structure 240 (cf. subsequent FIG. 4). This may occur in both directions, i.e. a defect may grow or shrink in the multilayer structure 240 and/or may change its form. Defects of a mask blank 250 which do not originate exclusively on the surface 260 of the capping layer 130 are also referred to hereinafter as buried defects.

As already mentioned above various further types of defect may be present in a mask blank 250. Alongside pits 220 of the substrate 210, local bumps may occur on the surface 115 of the substrate 210. By way of example, these may arise as a consequence of a polishing process for the surface 115 of the substrate 210.

Figure 3:
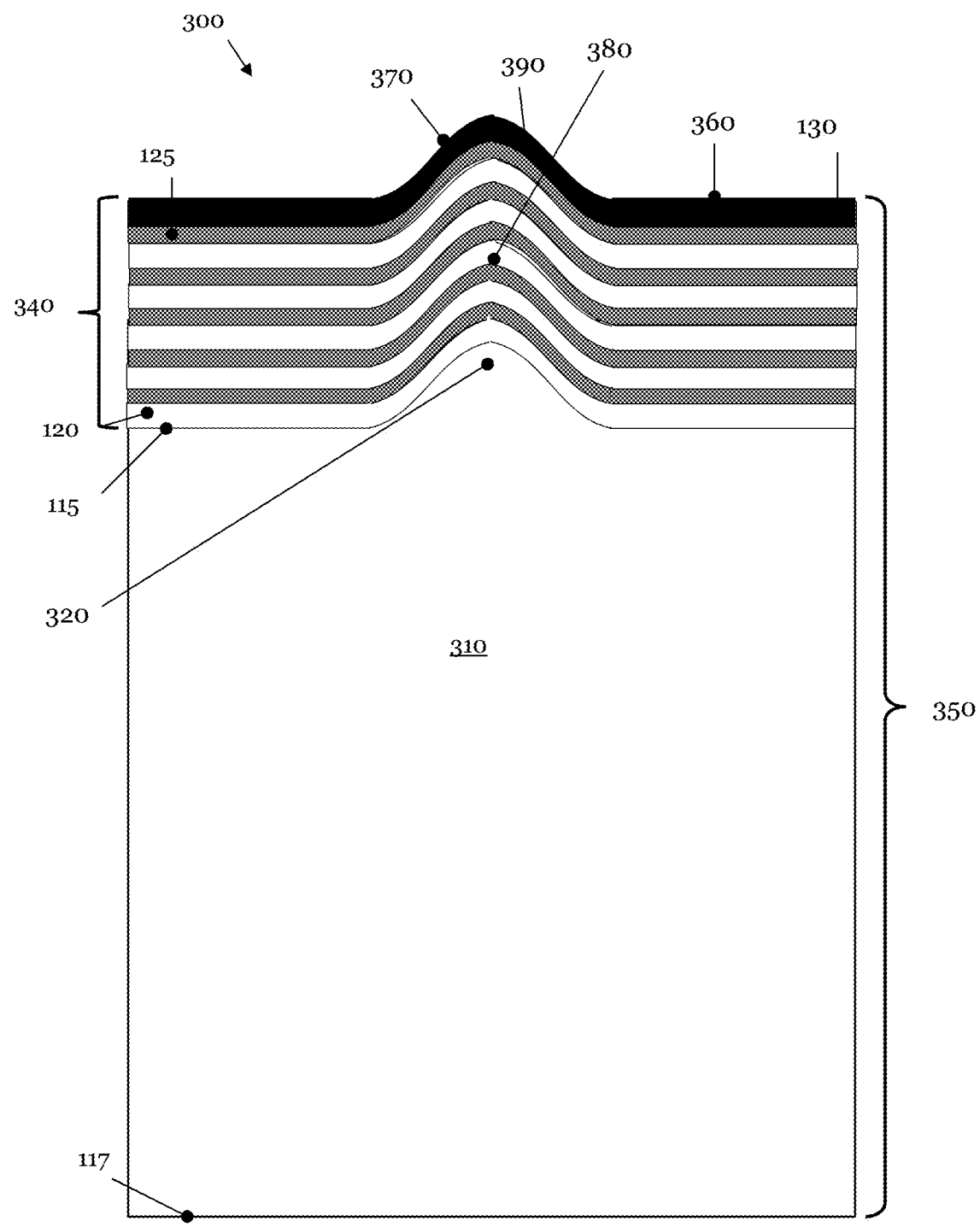
FIG. 3 schematically has a cross section through an excerpt from a mask blank, the substrate of which has a local bump.

The example in FIG. 3 represents a section through the local defect 320 having the form of a bump of the front side 115 of the substrate 310. In a manner similar to that in FIG. 2, the local defect 320 propagates substantially unchanged through the multilayer structure 340. In the examples of FIGS. 2 and 3, the defects 220 and 320 have a rotational symmetry and the surface contours 270, 370 can be described to a first approximation by way of a Gaussian profile. Mask substrates often have defects that have this symmetry on account of the final steps of the production method of the mask substrates 210, 310. However, it is not necessary for the defects of the mask blanks 250, 350 to have this form so that these can be repaired with the aid of the method described in this application.

Figure 4:
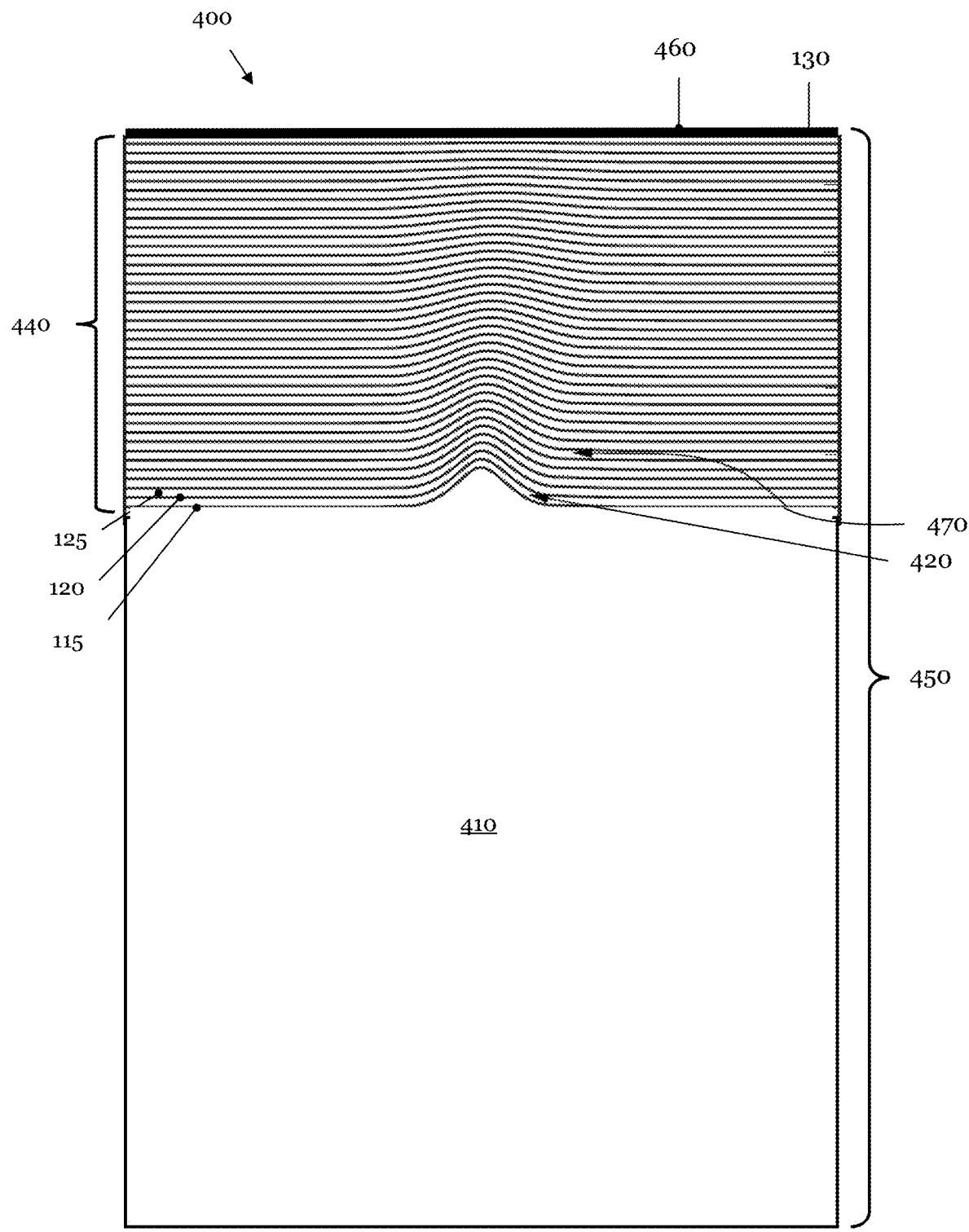
FIG. 4 schematically reproduces a cross section through a buried defect that changes its form during the propagation in the multilayer structure.

It is complicated to detect defects of the multilayer structure 240 which do not stand out on the surface 260 but nevertheless lead to visible faults during the exposure of an EUV mask. The diagram 400 in FIG. 4 schematically shows a section through an excerpt from a mask blank 450, the substrate 410 of which has a local bump 420 at the surface 115. The local defect 420 propagates in the multilayer structure 440. In the example of FIG. 4, the propagation 470 leads to a gradual attenuation of the height of the defect 420, which is accompanied by an increase in the lateral dimensions thereof at the same time. The final layers 120, 125 of the multilayer structure 440 are substantially planar. On the capping layer 130, no elevation can be determined in the region of the defect 420.

Figure 5:
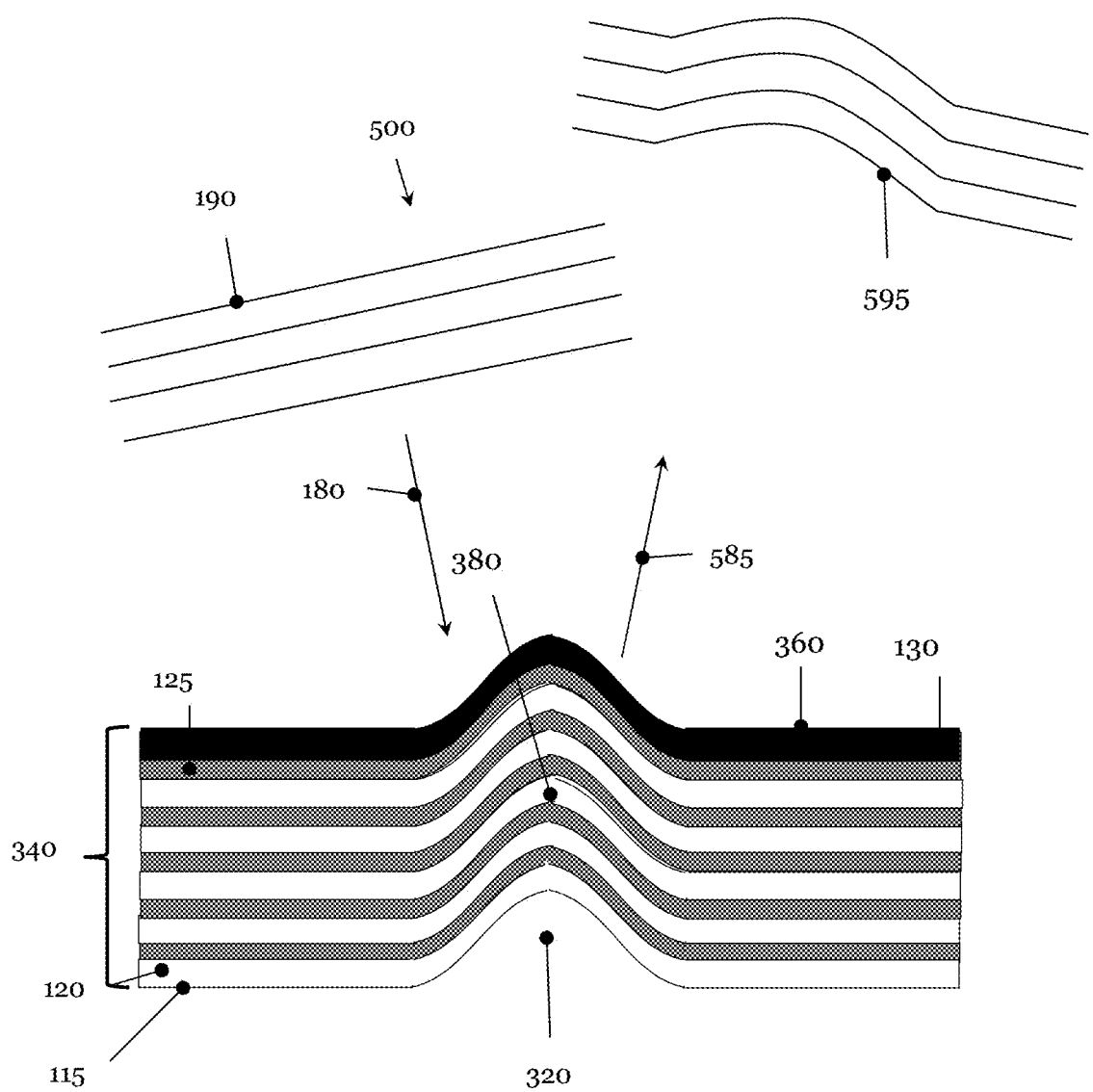
FIG. 5 schematically illustrates a phase front approaching the multilayer structure of FIG. 3 and a phase front that was reflected by the multilayer structure.

The diagram 500 in FIG. 5 elucidates one of the problems caused by the defect 320 or the contour 380 thereof in the multilayer structure 340. The incident EUV photons 180 produce a plane incoming phase front 190. Unlike the ideal EUV mask 100 of FIG. 1, the EUV photons 585, which are reflected by the multilayer structure 340 in the region of the defect 320 or of the contour 380 generated by the defect 320 in the multilayer structure 340, produce a disturbed phase front 595. Similar defects in the phase front of the outgoing electromagnetic waves are produced by the defects 220 and 420 of FIGS. 2 and 4. In some examples, the disturbed phase front 595 reduces the focal range that can be used by an exposure system or makes the use of an EUV mask having one of the defects 270, 370 and/or 420 wholly impossible.

Figure 6:
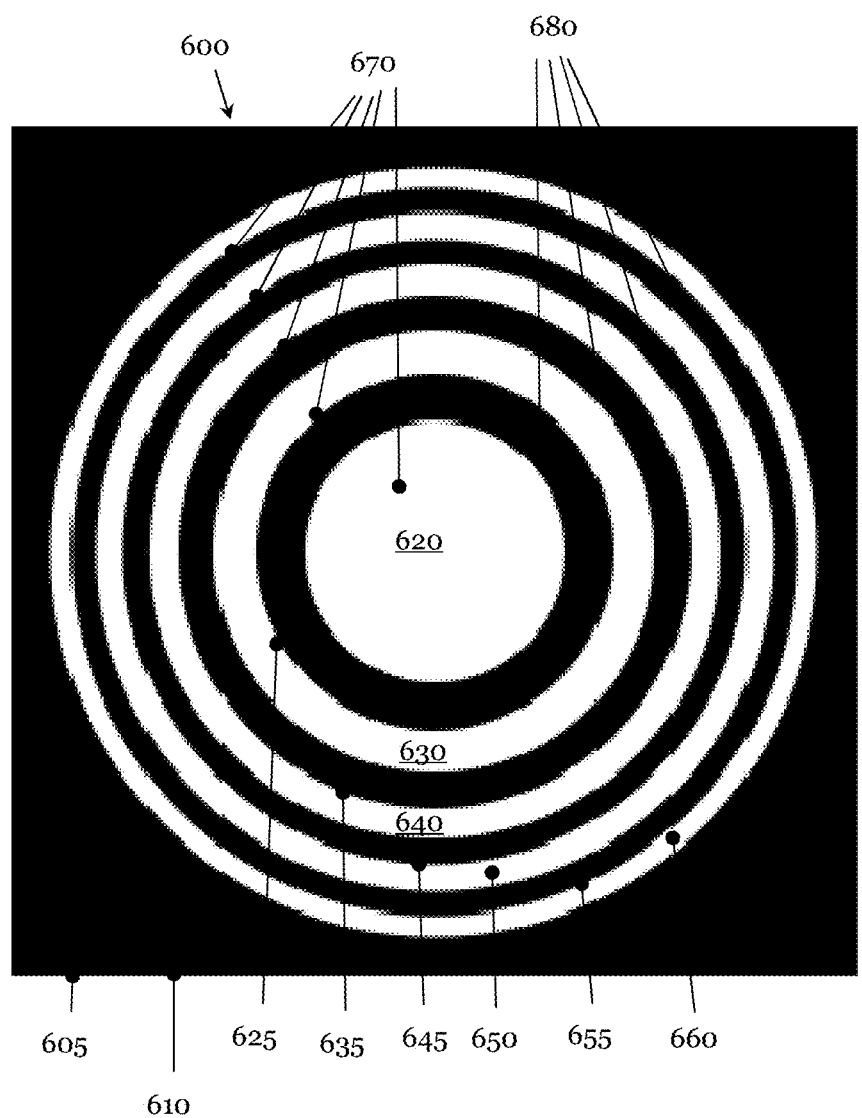
FIG. 6 reproduces an example of a repair shape in the form of an imaging structure, wherein the imaging structure is embodied in the form of a Fresnel zone plate.

FIG. 6 schematically shows a repair shape 600 that has an imaging structure 610 in the form of a Fresnel zone plate 605. In the example of FIG. 6, the zones 620, 630, 640, 650 and 660 form the first region 670 of the imaging structure 610. The odd orders of diffraction of the zones 620, 630, 640, 650, 660 are transparent to EUV photons 180, and so the EUV photons 180 do not experience any attenuation in the zones 620, 630, 640, 650 and 660 of the zone plate 605. However, the EUV photons 180 passing through the transparent zones 620, 630, 640, 650 and 660 are diffracted during the passage through the corresponding zone. The zones 625, 635, 645 and 655 of the zone plate 605 of the imaging structure 610 for the even orders of diffraction have a material and a thickness of the material such that EUV photons 180 incident on the zones 625, 635, 645, 655 substantially experience a phase change of 7C upon passage through these zones. For the purposes of optimizing the efficiency of the zone plate 605, it is expedient if the absorption of the zones 625, 635, 645, 655 is as low as possible. However, there currently is no material that has a negligible absorption at a thickness that leads to a phase shift of 180° in the zones 625, 635, 645 and 655 with an even order of diffraction. Consequently, the example of an imaging structure 610 illustrated in FIG. 6 is a combination of an amplitude zone plate and a phase zone plate.

Figure 7:
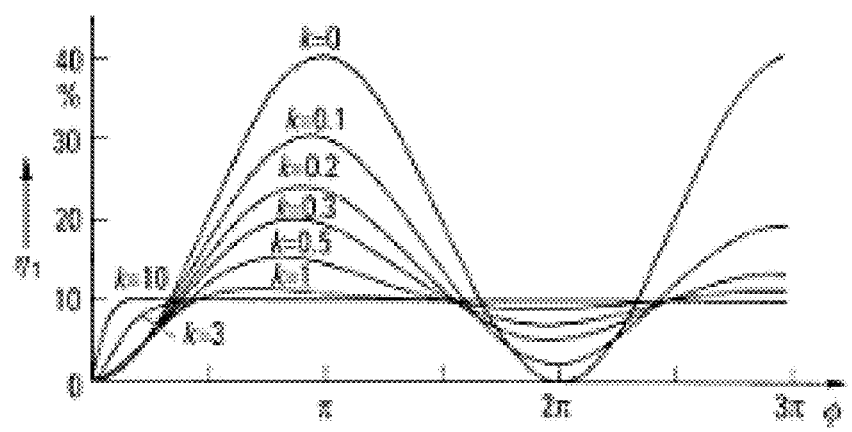
FIG. 7 illustrates the change in the effectiveness of diffraction of a zone plate at the transition from a phase zone plate to an amplitude zone plate.

FIG. 7 presents the diffraction efficiency of the diffraction effectiveness in the first order of diffraction $\eta_1$ of a zone plate as a function of the phase shift $\Phi$ between adjacent zones of the zone plate. The family of curves is parametrized by the variable $k=\beta/\delta$. Here, $\beta$ describes the imaginary part of the complex refractive index and $\delta$ denotes the deviation of the real part of the complex refractive number from 1 ($n=n-i\beta=1-\delta-i\beta$). The diagram of FIG. 7 has been taken from the book Bergmann Schäfer "Optik", Chapter 10.2, Page 1015, 10th edition, de Gruyter. It shows that phase zone plates, for which $k=\beta=0$ applies, have a significantly higher diffraction efficiency than amplitude zone plates ($k>1$). In the case of repairing a defect, it is therefore the aim to choose a material for the zone plate 605 of the imaging structure 610 of the repair shape 600, the absorption coefficient of which is as small as possible at the actinic wavelength of the EUV mask in order to maximize the diffraction efficiency of the zone plate 605. Currently preferred materials for producing a zone plate 605 are for example molybdenum (Mo) and/or niobium (Nb).

Referring back to FIG. 6, the zone plate 605 in the example of FIG. 6 has nine zones 620 to 660. For a number of zones n that is not too great, the radius $r_n$ of the n-th zone for the incidence of a plane wave on the zone plate 610 is given by $r_n = \sqrt{n \cdot \lambda \cdot f}$ (cf. Hecht Zajac, "Optics", page 376, Addison Wesley). This means that, at a given wavelength, the radii of the individual zones determine the focal length of the convex lens which forms the imaging structure 610 in the form of the zone plate 605. For typical defect dimensions with heights or depressions in the region of several nanometers and lateral dimensions of the defects 220, 320 and 420 in the two-digit nanometer range, a repair shape 600 having an imaging structure 610 in the form of the zone plate 605 has a lateral dimension in the three-digit nanometer range for ten zones. Simulation results show that a zone plate 605 with ten zones has a focusing effect for the EUV photons that pass therethrough, said focusing effect being sufficient to compensate the phase component of a typical defect 220, 320, 420 of the multilayer structure 240, 340, 440.

Figure 8:
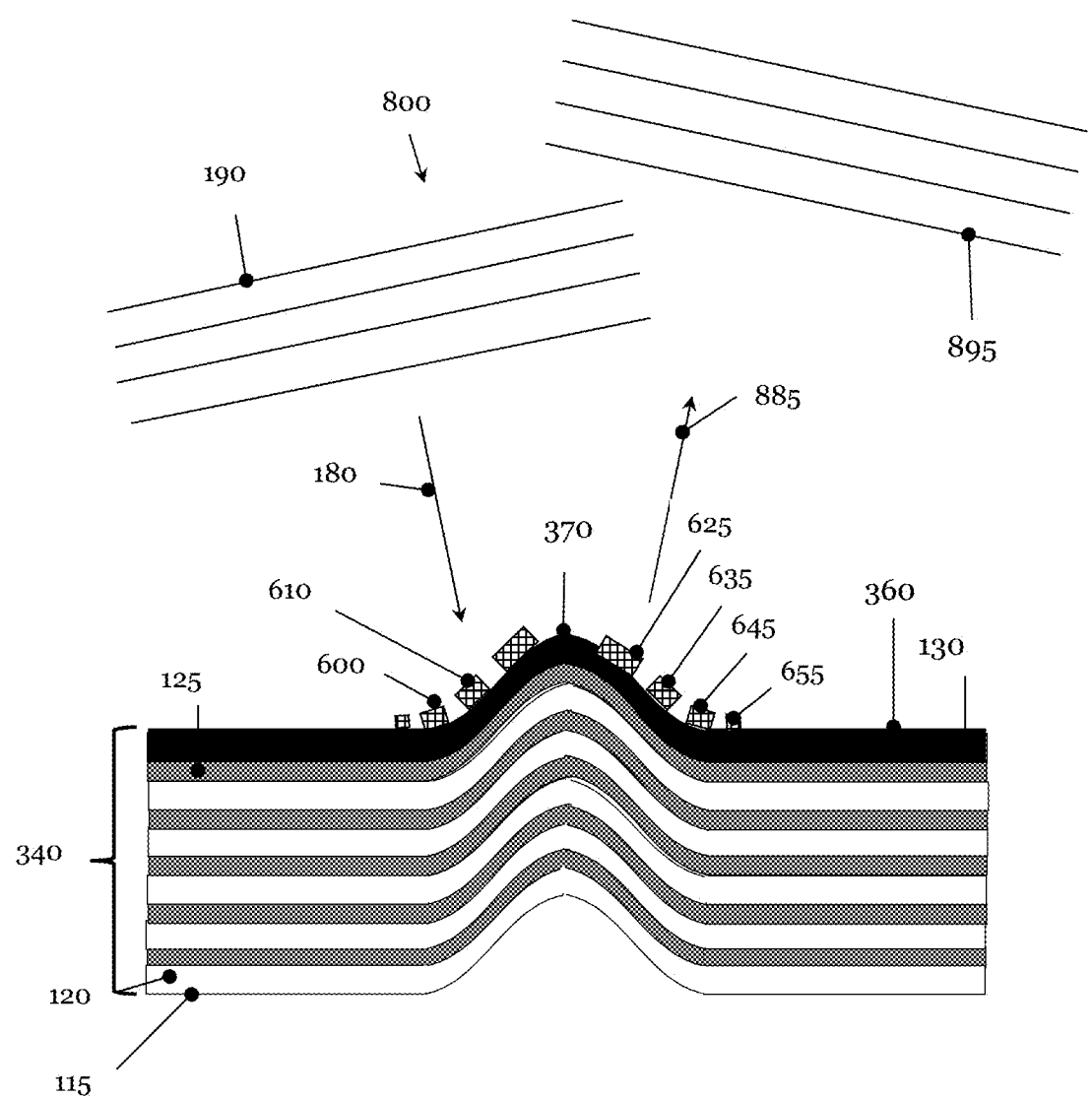
FIG. 8 elucidates FIG. 5 after attaching a repair shape onto the defect, wherein the repair shape has an imaging structure in the form of a Fresnel zone plate.

The diagram 800 in FIG. 8 shows the multilayer structure 340 of the mask blank 350 of FIG. 3. A repair shape 600 in the form of a zone plate 610 has been deposited over the defect 370; i.e., the imaging structure 610 has a Fresnel zone plate 605 in the example of FIG. 8. Depositing the repair shape 600 and ascertaining the repair shape 600 can be effectuated by way of the system presented in FIG. 14. In the example illustrated in FIG. 8, molybdenum was used as a material for the imaging structure 610. As already explained above, the thickness of the individual zones was selected in such a way that the EUV photons experience a phase change of 180° or π upon passage through the zones 625, 635, 645 and 655. As is clear from FIG. 8, the repair shape 600, which has an imaging structure 610 in the form of the zone plate 605, compensates the phase disturbance caused by the defect 320. The phase front 895 of the outgoing EUV photons 885 substantially has the form of the phase front 190 of the incoming EUV photons 180.

By determining corresponding imaging structures in the form of individually designed zone plates, the defects 220 and 420 of the multilayer structures 240 and 440 can likewise be repaired.

It is possible to determine imaging structures in the form of zone plates that are individually matched to the respective defect for the phase disturbances of the defects 220 and 420 of the multilayer structures 240, 440 of the mask blanks 250 and 450. By depositing the corresponding imaging structures as a repair shape onto the respective defect 220 and 420, it is possible to compensate the displacement of the phase of these defects.

The repair process described in this application has the great advantage that the multilayer structure 240, 340, 440 of an EUV mask need not be modified. A partial removal of the capping layer 130 from the surface of the multilayer structure 240, 340, 440 can cause parts of the multilayer structure 240, 340, 440 to be inadvertently modified during the repair process, said modifications precluding the further use of the repaired EUV mask. This does not happen in the case of a repair process as described here. Should problems occur when ascertaining the repair shape 600 and/or when depositing the ascertained repair shape 600 onto the defect 220, 320, 420, the repair shape 600 has to be removed from the multilayer structure 240, 340, 440 again in the worst-case scenario. In this process, the multilayer structure 240, 340, 440 is protected by the undamaged capping layer 130.

The symmetry of the imaging structure 610 in the form of a zone plate 605 emerges from the symmetry of the defects 220, 320, 420. However, this does not mean that the methods for correcting defects of the multilayer structure 240, 340, 440 of EUV masks discussed here are restricted to the rotationally symmetric defects 220, 320 and 420, described here, or to the rotationally symmetric defects 220, 320 with a Gaussian surface contour 290, 390. Instead, a repair shape 600 may comprise an imaging structure 610 that is designed to prepare a phase disturbance of a defect with any surface contour. The imaging structure 610 can be determined with the aid of the simulation from the superposition of a plane electromagnetic wave approaching the imaging structure 610 and an electromagnetic wave originating from the focus of the imaging structure.

Figure 9:
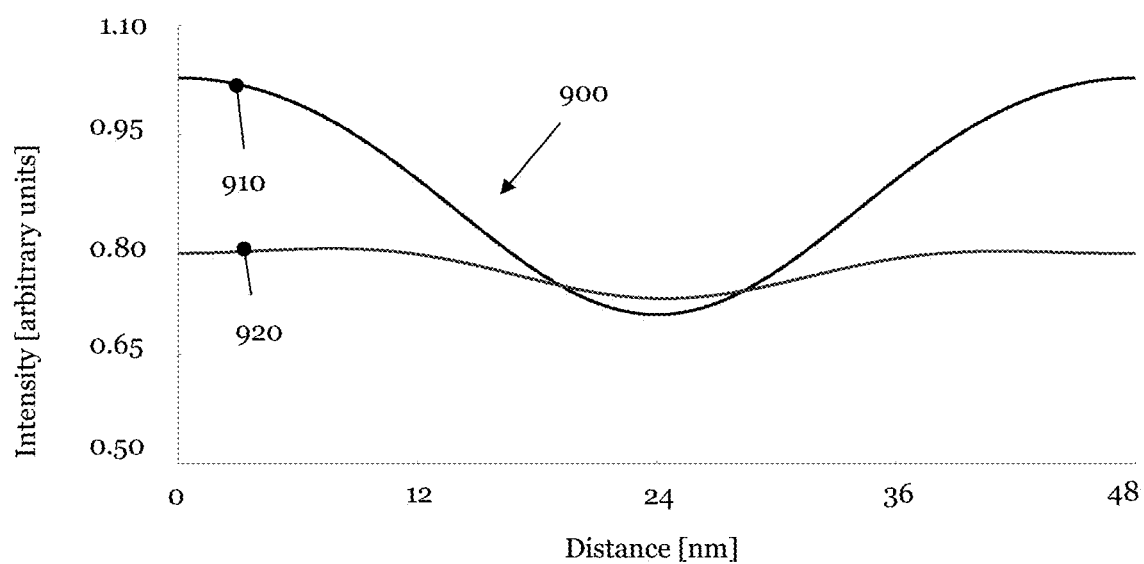
FIG. 9 reproduces a simulated intensity curve of reflected optical radiation over a defect of a multilayer structure, said optical radiation being reflected by a multilayer structure of an EUV mask, wherein the multi-layer structure has a defect in the form of a local bump and the intensity curve shows a repaired defect, wherein the defect was repaired by depositing a repair shape, ascertained for the defect, on the defect.

The diagram of FIG. 9 shows, by way of the curve 910, a section through the intensity profile of a simulated aerial image of an EUV mask. The multilayer structure of the EUV mask has a defect in the form of a local bump with a height of 5 nm and a Gaussian surface contour with a width of 20 nm at a drop to $e^{-2}$. From the curve 910, it is possible to gather that the defect leads to reduction in the normalized reflected optical intensity from approximately 1.0 to approximately 0.7.

The curve 920 represents the intensity profile of a simulated aerial image after the defect has been repaired. A repair shape 600 that has an imaging structure 610 in the form of a Fresnel zone plate 605 was determined for the purposes of repairing the defect. The zone plate 605 of the repair shape 600 for repairing the defect of FIG. 9 has 16 zones. In the second step, the reflected optical intensity distribution was simulated in the region of the repaired defect. The simulation of the repaired defect was based on the optical properties of molybdenum. The variation in the optical intensity distribution over the repaired defect is less than 0.1.

In addition to reducing the variation in the optical intensity over the defect by approximately a factor of three, it was additionally possible to slightly lift the optical intensity in the region of the defect in comparison with the curve 910. The variation of the optical intensity profile over the defect can be improved further by virtue of increasing the number of zones of the zone plate 605.

As already explained, the imaging structure 610 of the repair shape 600 has significantly reduced the variation in the optical intensity over the defect. However, the level of the optical intensity reflected from the region of the defect overall has dropped. As a result of a compensational repair of the absorber pattern, it is possible to correct the reduction in the reflected optical intensity.

Figure 10:
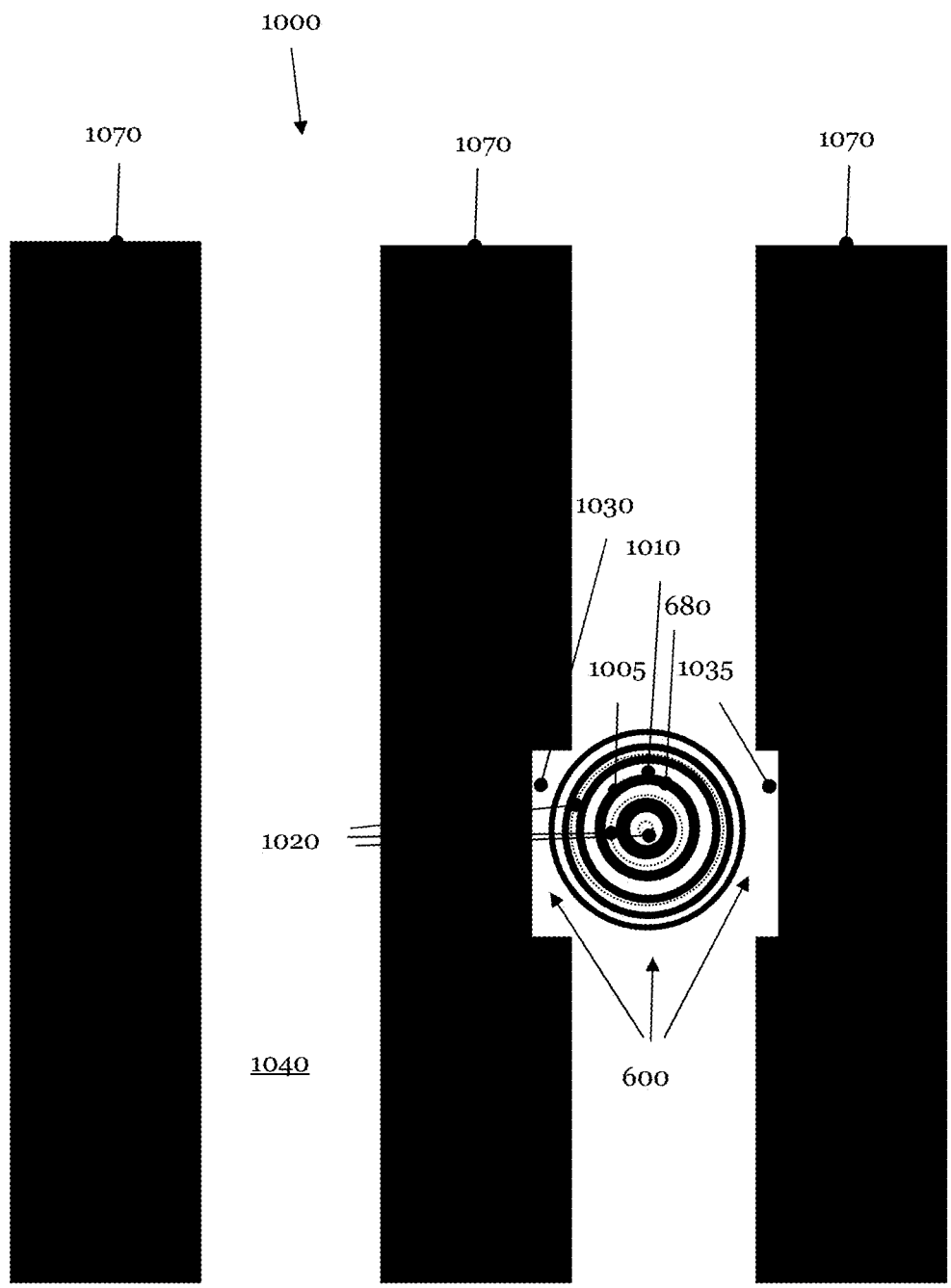
FIG. 10 presents a repair shape for correcting the phase disturbance and the amplitude disturbance of a defect of a multilayer structure of an EUV mask.

FIG. 10 shows a plan view of an excerpt of an EUV mask 1000. Three elements of an absorber pattern 1070 in the form of stripes are applied to the surface of the multilayer structure 1040 of the EUV mask 1000. The EUV mask 1000 has the defect 1020 between the central and right-hand stripe. In order to repair the defect 1020, a repair shape 600 for the defect 1020 is ascertained in a first step. The repair shape comprises an imaging structure 1010 in the form of a Fresnel zone plate 1005. The imaging structure 1010 in FIG. 10 is designed to repair the phase disturbance caused by the defect 1020. Additionally, the repair shape 600 of FIG. 10 comprises the two changes 1030 and 1035 of the absorber pattern 1070. The two changes 1030 and 1035 of the absorber pattern 1070 include the removal of parts of the absorber pattern 1070 for the purposes of correcting the amplitude disturbance of the defect 1020. The extent of the changes 1030 and 1035 is determined within the scope of ascertaining the repair shape 600. When determining the changes 1030 and 1035 of the absorber pattern 1070, the intensity change caused by the imaging structure 1010, i.e. the second regions 680 of the zone plate 1005, is taken into account. In the example illustrated in FIG. 10, the repair shape 600 contains the imaging structure 1010 and the changes 1030 and 1035 of the absorber pattern 1070.

In a second step, the repair shape 600 is produced in the EUV mask 1000 by virtue of, initially, the parts of the absorber pattern 1070 requiring the changes 1030 and 1035 being removed by use of a particle-beam-induced etching method. A particle-beam-induced etching method can be performed, for example, with the aid of an electron beam and xenon difluoride ($XeF_2$) as etching gas. Thereupon, the imaging structure 1010 is deposited on the defect 1020 with the aid of an electron-beam-assisted deposition method. Instead of an electron beam, an ion beam and/or photon beam may also be used for the purposes of changing the absorber pattern 1070 and for the purposes of depositing the imaging structure 1010. An electron beam is advantageous in that no damage, or only very little damage, is produced at the EUV mask 1000 by the repair process of the defect 1020, with said performed process being very efficient.

Figure 11:
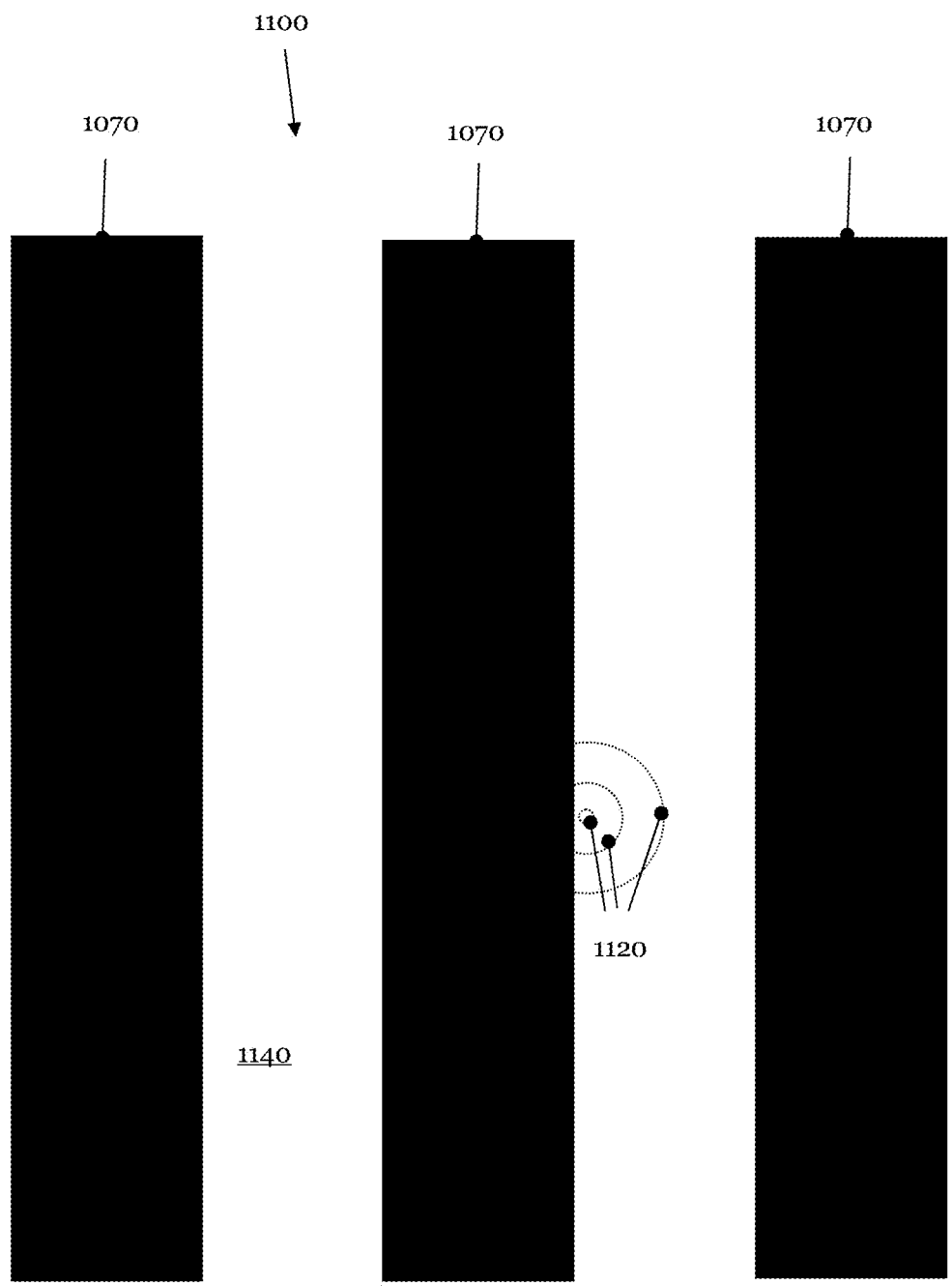
FIG. 11 shows a defect which is partly covered by an absorber pattern.

FIG. 11 shows a plan view of an excerpt of an EUV mask 1100. Once again, an absorber pattern 1070 is applied on the surface of the multilayer structure 1140 thereof. The excerpt of FIG. 11 presents three stripes of the absorber pattern 1070. In the vicinity of the central stripe, the multilayer structure 1140 has a defect 1120 that is partly covered by the absorber pattern 1070.

In a first alternative, a repair shape 600 is ascertained for the visible, and therefore in any case effective, part of the defect. Additionally, the repair shape 600 may contain a removal of parts of the absorber pattern 1070 around the defect 1120. Then, as described in the context of the discussion of FIG. 10, the repair shape 600 is produced on the defect 1120.

However, this procedure has two disadvantages. Firstly, the part of the defect visible at the surface need not correspond to its effect within the multilayer structure 1140. Secondly, removing parts of the absorber pattern 1070 in the vicinity of the defect 1120 may inadvertently strengthen the effect of the defect.

Figure 12:
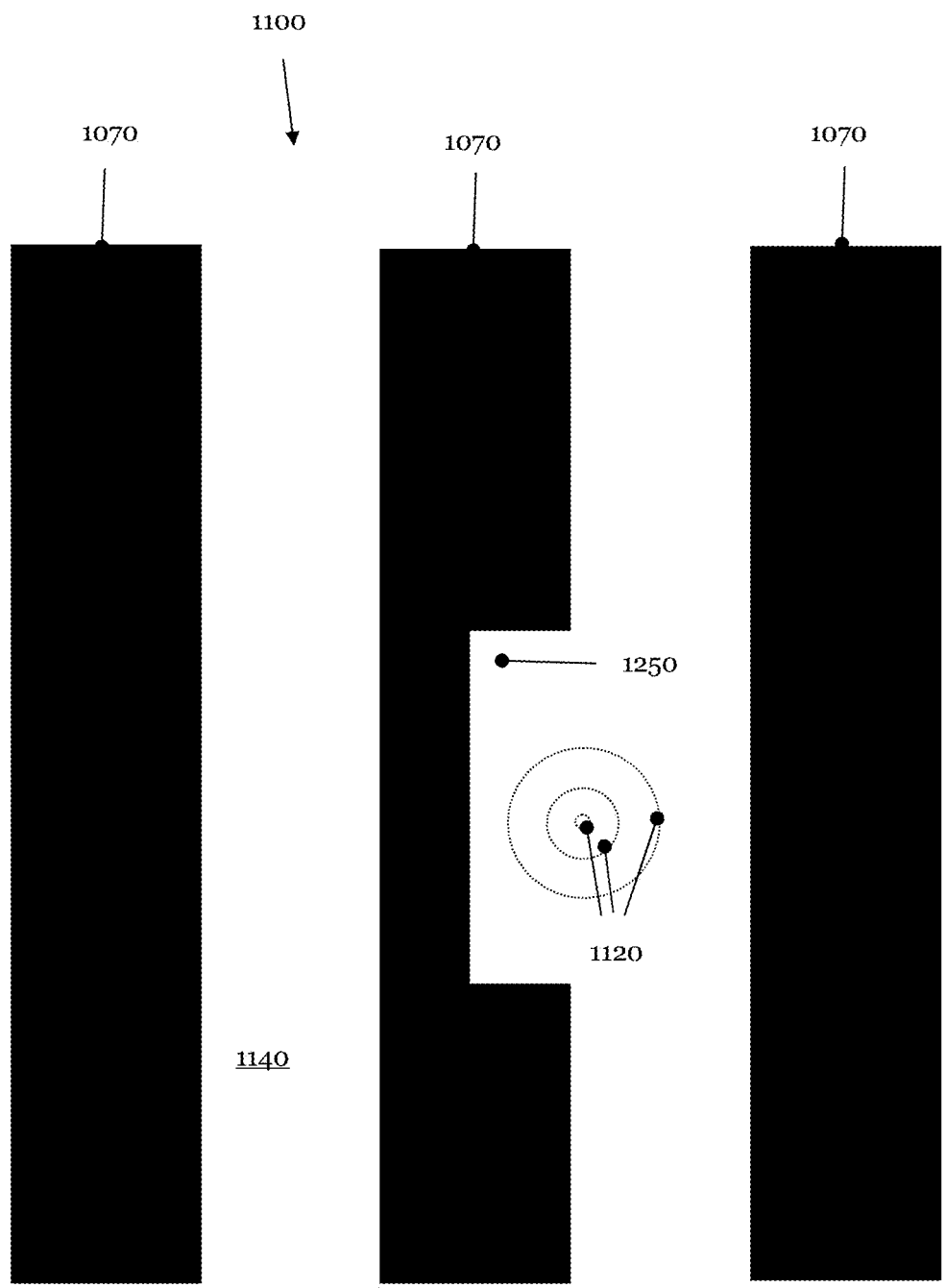
FIG. 12 illustrates the defect of FIG. 11 after part of the absorber pattern around the defect was removed in order to expose the defect.
Figure 13:
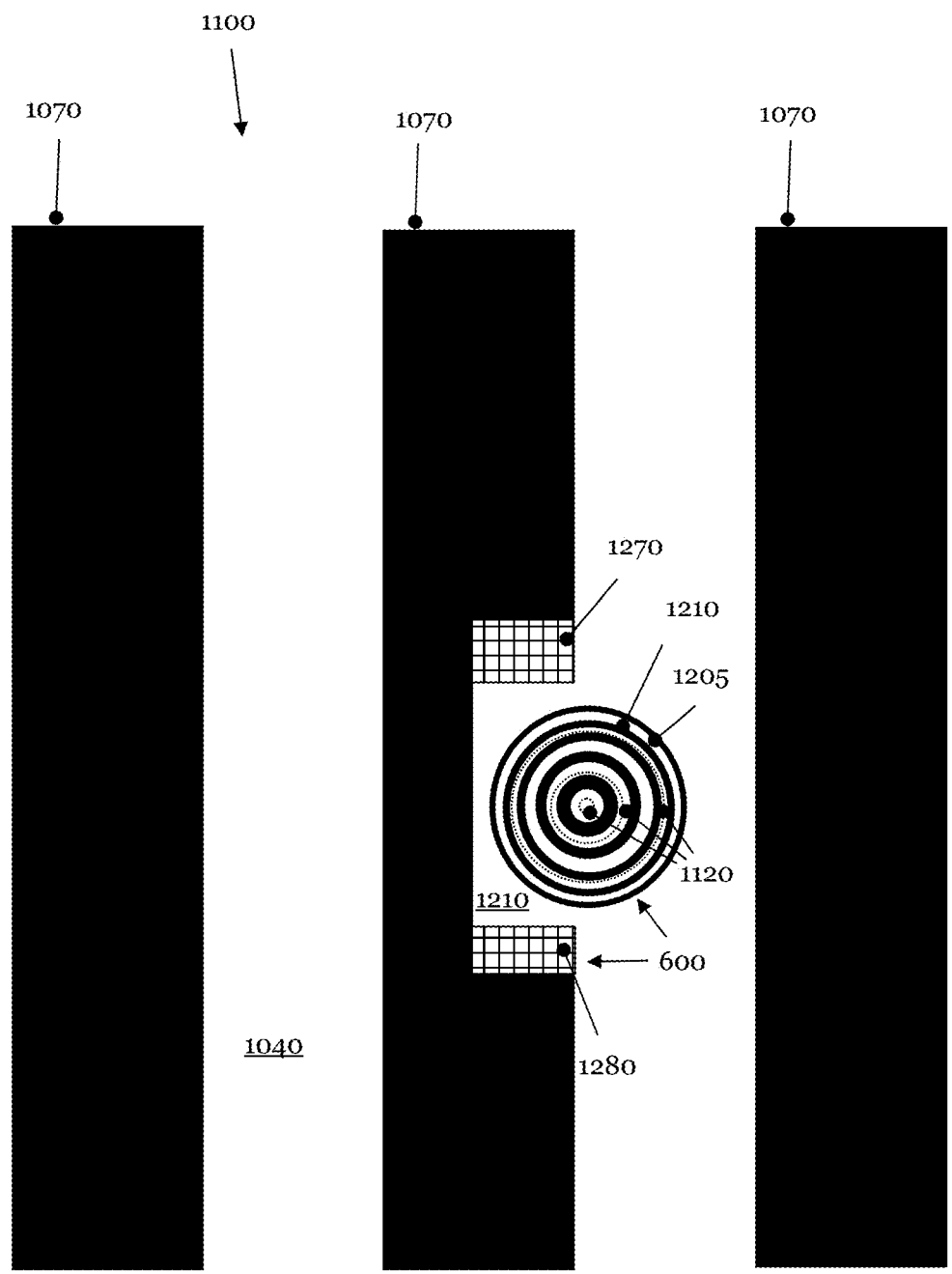
FIG. 13 represents the excerpt from FIG. 12 after the defect has been repaired.

FIGS. 12 and 13 therefore describe a second type of correction of the defect 1120. As illustrated in FIG. 12, part 1250 of the absorber structure 1070 around the defect 1120 is removed in a first step. This can be effectuated by a particle-beam-induced etching process. As already mentioned in the context of FIG. 10, the removal of the part 1250 of the absorber pattern 1070 can be effectuated, for example, with the aid of an electron beam and the xenon difluoride ($XeF_2$) etching gas.

A repair shape 600 is determined for the now exposed defect 1120, said repair shape comprising the ascertainment of an imaging structure 1210 in the form of a Fresnel zone plate 1205. In a next step, changes 1270 and 1280 of the absorber pattern 1070 are thereupon determined, said changes, firstly, repairing the amplitude disturbance of the defect 1120 and taking account of the absorption of the second regions 680 of the imaging structure 1210 and, secondly, minimizing the change, caused by the removal of the part 1250 of the absorber pattern 1070, of the radiation reflected in the region of the defect 1120. In the example illustrated in FIG. 13, the repair shape 600 contains the imaging structure 1210 and the changes 1270 and 1280 of the absorber pattern 1070. Depositing the parts 1270 and 1280 of the absorber pattern 1070 can be effectuated, for example, with the aid of a particle-beam-induced deposition process. A particle-beam-induced deposition process can be effectuated, for instance, with an electron beam and a metal carbonyl, for example with a chromium carbonyl or a titanium carbonyl.

Figure 14:
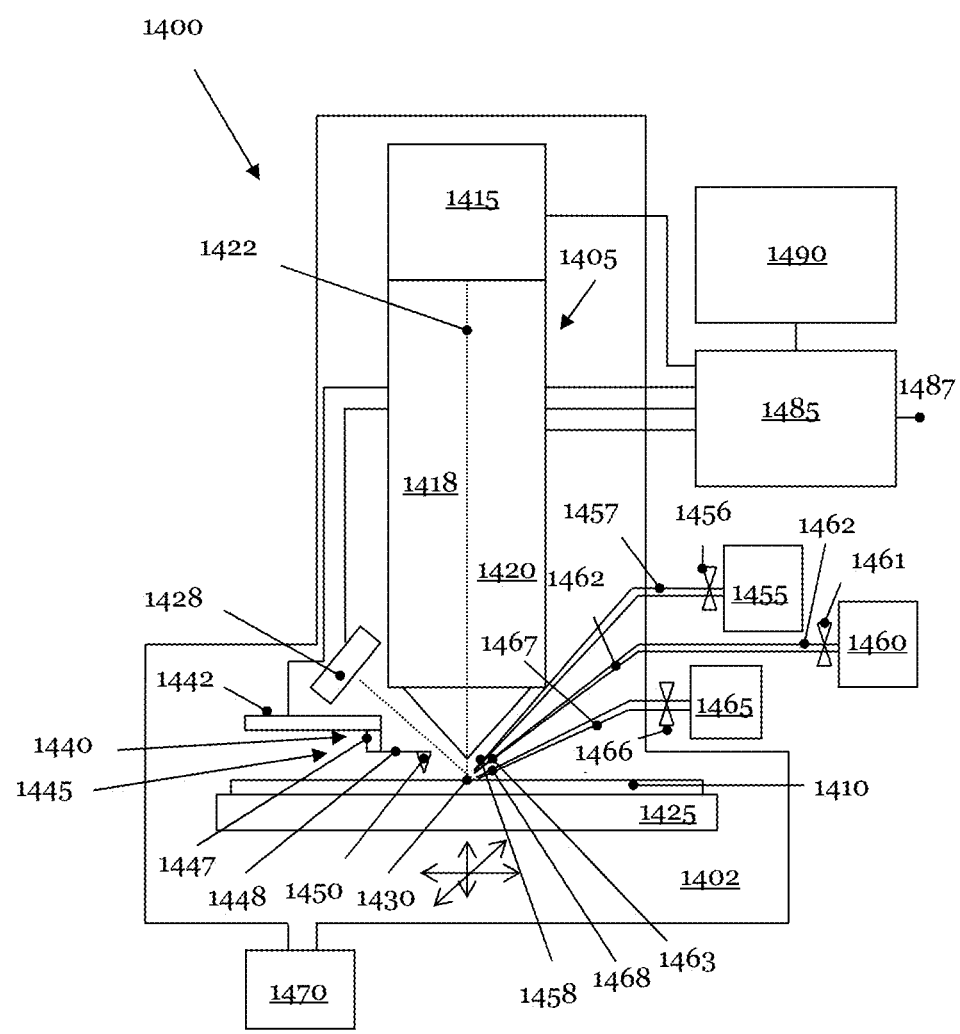
FIG. 14 schematically shows an apparatus with which the methods described herein can be carried out.

FIG. 14 schematically shows, in a section, some components of an apparatus 1400 that can be used to carry out the method steps explained above. The example illustrated in FIG. 14 presents a combination of a scanning particle microscope 1405 in the form of a scanning electron microscope (SEM) 1405 and a scanning probe microscope 1440 in the form of an atomic force microscope 1440. As already explained above, an electron beam as a particle beam has the advantage that it essentially cannot damage an EUV mask 1410, or only to a slight extent. However, other charged particle beams are also possible, for example an ion beam of an FIB (Focused Ion Beam) system (not illustrated in FIG. 14).

In some implementations, the SEM 1405 comprises as essential components a particle gun 1415 and a column 1418, in which the electron optics or beam optics 1420 is arranged. The electron gun 1415 produces an electron beam 1422 and the electron or beam optics 1420 focuses the electron beam 1422 and directs it at the output of the column 1418 onto the EUV mask 1410, which may be identical to the EUV masks 1000 and 1100 of FIGS. 10 to 13.

The EUV mask 1410 is arranged on a specimen stage 1425. As symbolized in FIG. 14 by the arrows, the specimen stage 1425 can be moved in three spatial directions in relation to the electron beam 1422 of the SEM 1405.

The apparatus 1400 contains a detector 1428 for detecting the secondary electrons or backscattered electrons produced at the measurement point 1430 by the incident electron beam 1422. The detector 1428 is controlled by the control device 1485. Furthermore, the control device 1485 of the apparatus 1400 receives the measurement data of the detector 1428. The control device 1485 can generate images from the measurement data, said images being represented on a monitor 1490. The apparatus may additionally have a detector for detecting the photons produced by the incident electron beam 1422 (not illustrated in FIG. 14). By way of example, this detector can spectrally resolve the energy spectrum of the generated photons and thereby allow conclusions to be drawn concerning the composition of the surface or layers near the surface of the EUV mask 1410.

Moreover, the measurement apparatus 1400 may comprise an ion source which provides low-energy ions in the region of the measurement point 1430, said low-energy ions preventing the EUV mask 1410 or the surface thereof from having a negative surface charge (not illustrated in FIG. 14). With the aid of an ion source, it is possible to reduce a negative charge of the EUV mask 1410 in a local and controlled fashion and hence possible to prevent a reduction in the lateral spatial resolution of the electron beam 1422.

Should the EUV mask 1410 have an undesired distribution of positive surface charges, caused for instance by the handling of the EUV mask 1410, the electron beam 1422 can be used to reduce the charge of the EUV mask 1410.

The electron beam 1422 of the apparatus 1400 can be used to analyze the defects 220, 320, 420, 1020 and 1120. Hence, the electron beam 1422 of the apparatus 1400 is suitable for determining the defects 220, 320, 420, 1020, 1120.

As already explained above, the exemplary apparatus 1400 also comprises a scanning probe microscope 1440 in the form of an atomic force microscope (AFM) 1440, in addition to an SEM 1405. FIG. 14 shows a schematic section through some important components of a scanning probe microscope 1440. The scanning probe microscope 1440 contains a measuring head 1442. The measuring head 1442 comprises a holding apparatus 1445. The measuring head 1442 is fastened to the frame of the apparatus 1400 by use of the holding apparatus 1445 (not shown in FIG. 14). A piezo-actuator 1447 which facilitates a movement of the free end of the piezo-actuator 1447 in three spatial directions (not illustrated in FIG. 14) is attached to the holding apparatus 1445 of the measuring head 1442. Fastened to the free end of the piezo-actuator 1477, there is a bending bar 1448 which is referred to as a cantilever 1448 below, as is conventional in the art. The end of the cantilever 1448 distant from the piezo-actuator 1447 carries a measuring tip 1450. The measuring tip 1450 may have a pyramidal form.

The cantilever 1448 and the measuring tip 1450 may be configured in one piece. By way of example, the cantilever 1448 and the measuring tip 1450 may be manufactured from a metal, such as, for instance, tungsten, cobalt, iridium, a metal alloy or from a semiconductor, such as, for instance, silicon or silicon nitride. It is also possible to manufacture the cantilever 1448 in the measuring tip 1450 as two separate components and to subsequently connect these to one another. This can be effectuated by adhesive bonding, for example.

The measuring head 1442 may comprise a sensor which transmits measurement data to the computer system 1485 of the apparatus when scanning the measuring tip 1450 over the surface of the EUV mask 1410 (not illustrated in FIG. 14). The sensor may comprise a light-pointer system and/or a piezo-resistive sensor. The computer system 1485 is capable of ascertaining an image of the surface of the EUV mask 1410 from these data and capable of displaying said image on the monitor or display 1495 of the computer system 1485.

The computer system 1485 comprises an interface 1487. By way of this interface, it is possible to connect the computer system 1485 to a detector of a laser system, an AIMS™ (Aerial Image Metrology System) and/or an exposure system for photolithographic masks (not illustrated in FIG. 14). By way of the interface 1487, the computer system 1485 is able to receive measurement data from the aforementioned exemplary instruments. In particular, the computer system 1485 can receive measurement data of a focus stack of aerial image measurements or measurements containing a tuning of an AIMS™ through the focus of the EUV mask 1410 via the interface 1487. From these measurement data, the computer system 1485 is able to reconstruct the phase disturbance, emanating from a defect 220, 320, 420, 1020, 1120, of a phase front 595 that is reflected by the EUV mask 1410 in the region of the defect 220, 320, 420, 1020, 1120.

The computer system 1485 further comprises a scanning unit which scans the electron beam 1422 over the EUV mask 1410. The scanning unit controls deflection elements in the column 1418 of the SEM 1405, which are not illustrated in FIG. 14. Furthermore, the computer system 1485 comprises a setting unit in order to set and control the various parameters of the SEM 1405. Parameters that can be set by the setting unit may be for example: the magnification, the focus of the electron beam 1422, one or more settings of the stigmator, the beam displacement, the position of the electron source and/or one or more stops (not illustrated in FIG. 14).

The apparatus 1400 for determining a defect 220, 320, 420, 1020, 1120 for ascertaining a repair shape 600 for the defect and for producing the repair shape 600 on the defect 220, 320, 420, 1020, 1120 preferably comprises a plurality of different storage containers for different gases or precursor gases. Three storage containers 1455, 1460 and 1465 are illustrated in the exemplary apparatus 1400 of FIG. 14. However, an apparatus 1400 may also have more than three storage containers for processing an EUV mask 1410, i.e. for producing a repair shape 600.

In some implementations, the first storage container 1455 stores a precursor gas or a first deposition gas, which can be used in cooperation with the electron beam 1422 of the SEM 1405 for depositing material in the form of an imaging structure 610, 1010, 1210 on the defect 220, 320, 420, 1020, 1120 of the EUV mask 1410. The first storage container 1455 may have a precursor gas in the form of a metal carbonyl, for example molybdenum hexacarbonyl.

The second storage container 1460 contains an etching gas, with the aid of which part of the absorber pattern 1070 can be etched from the surface of the multilayer structure 240, 340, 440, 1040 and 1140 of the EUV mask 1410. By way of example, the second storage container 1460 may comprise xenon difluoride ($XeF_2$). Alternative etching gases which can be stored in the storage container 1460 are, e.g. a halogen or a compound containing a halogen.

The third storage container 1465 stores a second deposition gas, with the aid of which a material can be deposited as part of the absorber pattern 1070 on the multilayer structure 240, 340, 440, 1040, 1140 of the EUV mask 1410 within the scope of a particle-beam-induced deposition reaction, e.g. with the aid of an electron beam 1422. The third storage container may contain a metal carbonyl, e.g. chromium hexacarbonyl, for example.

Each storage container 1455, 1460, 1465 is equipped with its own valve 1456, 1461, 1466 to control the amount of gas particles provided per unit of time or the gas flow rate at the location of incidence 1430 of the electron beam 1422 on the surface of the EUV mask 1410. Furthermore, the three storage containers 1455, 1460, 1465 have dedicated gas feeds 1457, 1462 and 1467, which end with a nozzle 1458, 1463 and 1468 near the point of incidence 1430 of the electron beam 1422 on the EUV mask 1410. In the apparatus 1400 that is illustrated by way of example in FIG. 14, the valves 1456, 1461, 1466 are installed in the vicinity of the storage containers 1455, 1460, 1465. In an alternative embodiment, the valves 1456, 1461, 1466 may be arranged in the vicinity of the corresponding nozzle 1458, 1463, 1468 (not shown in FIG. 14). Each storage container 1455, 1460, 1465 may have a dedicated element for individual temperature setting and control. The temperature setting facilitates both cooling and heating for each gas. In addition, the gas feeds 1457, 1462, 1467 may likewise respectively have a dedicated element for setting and monitoring the temperature at which the gases are provided at the reaction location (likewise not shown in FIG. 14).

The apparatus 1400 of FIG. 14 may have a pump system 1470 to produce and maintain the required vacuum. In addition, the apparatus 1400 may include a suction extraction apparatus (not illustrated in FIG. 14). The suction extraction apparatus in combination with the pump system 1470 makes it possible that the fragments or constituents that are produced during the decomposition of a precursor gas and are not required for the local chemical reaction can substantially be extracted from the vacuum chamber 1402 of the apparatus 1400 at the point of origin. Since the gas constituents that are not required are pumped away locally at the point of incidence of the electron beam 1422 on the EUV mask 1410 out of the vacuum chamber 1402 of the apparatus 1400 before they can be distributed and settle in it, contamination of the vacuum chamber 1402 is prevented.

For initiating an etching reaction or a depositing process, preferably a focused electron beam 1422 is exclusively used in the apparatus 1400 that is given by way of example in FIG. 14.

Finally, FIG. 15 shows a flowchart 1500 of an exemplary embodiment of the method, defined in this application, for repairing defects 220, 320, 420, 1020, 1120 of EUV masks 1000, 1100. The method begins in step 1510. A defect 220, 320, 420, 1020, 1120 is determined in a first step 1520. For the purposes of determining the defect, it is possible to use the measurement instruments of the apparatus 1400; i.e., the electron beam 1422 of the SEM 1405 and/or the measuring tip 1450 of the AFM 1440 can be used. Alternatively, or additionally, the computer system 1485 can receive measurement data from further measurement appliances via the interface 1487.

At step 1530, a repair shape 600 for the defect 220, 320, 420, 1020, 1120 is ascertained, wherein the repair shape 600 is diffraction-based in order to take account of a phase disturbance by the defect. The repair shape 600 can be determined by the computer system 1485 of the apparatus 1400. To this end, the computer system may have algorithms which are carried out in hardware, firmware, software or a combination thereof. The repair shape 600 may comprise an imaging structure 610, 1010, 1210 and additional changes 1030, 1035, 1270, 1280 of the absorber pattern 1070.

In the optional step 1540, the ascertained repair shape 600 is produced by depositing an imaging structure 610, 1010, 1210 on at least one part of the at least one defect 220, 320, 420, 1020, 1120. Finally, the method ends in step 1550.

In some implementations, the computer system 1485 (FIG. 14) can include one or more processors and one or more computer-readable media (e.g., ROM, DRAM, SRAM, SDRAM, hard disk, optical disk, and flash memory). The one or more processors can perform various computations described above. The computations can also be implemented using application-specific integrated circuits (ASICs). The term "computer-readable medium" refers to a medium that participates in providing instructions to a processor for execution, including without limitation, non-volatile media (e.g., optical or magnetic disks), and volatile media (e.g., memory) and transmission media. Transmission media includes, without limitation, coaxial cables, copper wire, fiber optics and free space. The memory can include any type of memory, such as ROM, DRAM, SRAM, SDRAM, and flash memory.

The features described above can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language (e.g., C, Java), including compiled or interpreted languages, and it can be deployed in any form, including as a stand-alone program or as a module, component, subroutine, a browser-based web application, or other unit suitable for use in a computing environment.

Suitable processors for the execution of a program of instructions include, e.g., general purpose microprocessors, special purpose microprocessors, digital signal processors, single-core or multi-core processors, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM, DVD-ROM, and Blu-ray BD-ROM disks. The processor and the memory can be supplemented by, or incorporated in, ASICs (application-specific integrated circuits).

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Thus, particular embodiments of the subject matter have been described. Other embodiments are within the scope of the following claims. In some cases, the actions recited in the claims can be performed in a different order and still achieve desirable results. For example, the repair shape 600 can include more or fewer zones than those shown in the figures and described above. The repair shape 600 can also have a geometry or shape that is different from those shown in the figures and described above.

What is claimed is:

1. A computer-implemented method for repairing at least one defect of a photolithographic mask for the extreme ultraviolet (EUV) wavelength range, the method including the steps of:
    a. determining, using a measurement instrument, the at least one defect; and
    b. ascertaining, using a computer, a repair shape for the at least one defect using measurement data determined for the at least one defect by the measurement instrument;
    c. wherein the repair shape comprises an imaging structure and wherein the repair shape is diffraction-based in order to take account of a phase disturbance by the at least one defect; and
    d. depositing a material that corresponds to the imaging structure on at least one part of the at least one defect, wherein the deposited material that corresponds to the imaging structure at least partially repairs the at least one defect or compensates the phase disturbance caused by the at least one defect.

2. The method according to claim 1, wherein determining the at least one defect comprises at least one of the following steps: analyzing the at least one defect with a scanning probe microscope, analyzing the at least one defect with a particle beam, producing an aerial image of the at least one defect at an actinic wavelength of the photolithographic mask, producing aerial images of a focus stack of the at least one defect at the actinic wavelength of the photolithographic mask, and exposing a wafer with the photolithographic mask.

3. The method according to claim 2, wherein ascertaining the repair shape comprises: reconstructing the phase disturbance of the at least one defect from the focus stack of aerial images of the at least one defect.

4. The method according to claim 1, wherein ascertaining the repair shape comprises: determining the imaging structure for the deposition on the at least part of the at least one defect, wherein the imaging structure has at least one first region that is transparent to electromagnetic radiation at an actinic wavelength and at least one second region that changes a phase of the electromagnetic radiation at the actinic wavelength and/or at least partly absorbs the electromagnetic radiation of the actinic wavelength.

5. The method according to claim 4, wherein determining the imaging structure comprises: determining the at least one first region and the at least one second region such that a phase of an electromagnetic wave at the actinic wavelength, which is incident on the imaging structure, substantially has no phase disturbance after a reflection from at least one corrected defect in comparison with an electromagnetic wave that is reflected by a defect-free region of a multilayer structure of the photolithographic mask.

6. The method according to claim 1, furthermore including the step of: determining a focal length of the imaging structure from a radius of curvature of a surface contour of the at least one defect.

7. The method according to claim 1, wherein a material for which $\beta/\delta<1$, preferably <0.7, more preferably <0.5, and most preferably <0.3 applies at the actinic wavelength is selected for the imaging structure, where $\delta$ denotes the deviation of the real part of the complex refractive index from 1 and $\beta$ denotes the imaginary part of the complex refractive index of the material.

8. The method according to claim 1, wherein the imaging structure comprises a Fresnel zone plate.

9. The method according to claim 8, wherein the Fresnel zone plate comprises at least four zones, preferably at least six zones, more preferably at least eight zones and most preferably at least ten zones.

10. The method according to claim 1, wherein ascertaining the repair shape further comprises: determining a change of part of an absorber pattern that is adjacent to the at least one defect for the purposes of at least partly correcting an amplitude disturbance caused by the at least one defect.

11. The method according to claim 10, wherein the repair shape comprises the imaging structure and the change of part of the absorber pattern.

12. The method according to claim 10, wherein ascertaining the repair shape further includes the step of: simulating the removal of a part of the absorber pattern, which is adjacent to the at least one defect, before ascertaining the repair shape.

13. The method according to claim 10, wherein the repair shape comprises the imaging structure and the change of the absorber pattern and wherein the change of the absorber pattern includes removing a part of the absorber pattern or wherein the change of the absorber pattern includes depositing a part of the absorber pattern.

14. The method of claim 10, comprising changing the part of the absorber pattern that is adjacent to the at least one defect to at least partly correct the amplitude disturbance caused by the at least one defect.

15. The method according to claim 1, wherein depositing the material that corresponds to the imaging structure on at least one part of the at least one defect comprises depositing the material that corresponds to the imaging structure by use of a first particle beam and a first deposition gas.

16. The method according to claim 15, wherein the first particle beam comprises an electron beam and/or the first deposition gas comprises a metal carbonyl.

17. An apparatus for repairing at least one defect of a photolithographic mask for the extreme ultraviolet (EUV) wavelength range, having:
 a. means for determining the at least one defect;
 b. means for ascertaining a repair shape for the at least one defect using measurement data determined by the means for determining the at least one defect;
 c. wherein the repair shape comprises an imaging structure, and wherein the repair shape is diffraction-based in order to take account of a phase disturbance by the at least one defect; and
 d. means for depositing a material that corresponds to the imaging structure on at least one part of the at least one defect, the deposited material that corresponds to the imaging structure at least partially repairing the at least one defect or compensating the phase disturbance caused by the at least one defect.

18. The apparatus according to claim 17, wherein the means for determining the at least one defect comprises a measurement instrument selected from the group of: a scanning probe microscope, a scanning particle microscope, a laser system, an AIMS™ (Aerial Image Metrology System) and a photolithographic exposure system.

19. The apparatus according to claim 17, wherein the means for depositing the material that corresponds to the imaging structure comprises means for providing a first particle beam and for providing a first deposition gas for depositing of the material that corresponds to the imaging structure.

20. The apparatus according to claim 17, further comprising: means for changing a part of an absorber pattern, wherein the means for changing the part of the absorber pattern comprises: means for providing a second particle beam, a second deposition gas and an etching gas, wherein changing the part of the absorber pattern and depositing the material that corresponds to the imaging structure in combination at least partially repair the at least one defect or compensate the phase disturbance by the at least one defect.

21. The apparatus of claim 17 in which the means for depositing the material that corresponds to the imaging structure comprises means for providing a first particle beam and for providing a first deposition gas.

22. The apparatus of claim 17, further comprising: means for changing a part of an absorber pattern, wherein the means for changing the part of the absorber pattern comprises: means for providing a second particle beam, a second deposition gas and an etching gas, wherein changing the part of the absorber pattern and depositing the material that corresponds to the imaging structure in combination at least partially repair the at least one defect or compensate the phase disturbance by the at least one defect.

23. The apparatus of claim 17 in which the means for determining the at least one defect is configured to perform at least one of: producing aerial images of a focus stack of the at least one defect at the actinic wavelength of the photolithographic mask, or exposing a wafer with the photolithographic mask.

24. The apparatus of claim 23 in which the means for ascertaining the diffraction-based repair shape for the at least one defect is configured to reconstruct the phase disturbance of the at least one defect from the focus stack of aerial images of the at least one defect.

25. The apparatus of claim 17 in which the material that corresponds to the imaging structure has at least one first region that is transparent to electromagnetic radiation at an actinic wavelength and at least one second region that changes a phase of the electromagnetic radiation at the actinic wavelength and/or at least partly absorbs the electromagnetic radiation of the actinic wavelength.

26. The apparatus of claim 25 in which the means for ascertaining the diffraction-based repair shape for the at least one defect is configured to determine the at least one first region and the at least one second region such that a phase of an electromagnetic wave at the actinic wavelength, which is incident on the imaging structure, substantially has no phase disturbance after the reflection thereof in comparison with an electromagnetic wave that is reflected by a defect-free region of a multilayer structure of the photolithographic mask.

27. The apparatus of claim 17 in which the means for ascertaining the diffraction-based repair shape for the at least one defect is configured to determine a focal length of the imaging structure from a radius of curvature of a surface contour of the at least one defect.

28. The apparatus of claim 17 in which the means for ascertaining the repair shape for the at least one defect is configured to determine the imaging structure in which the material that corresponds to the imaging structure comprises a material for which $\beta/\delta<1$ applies at the actinic wavelength, in which $\delta$ denotes the deviation of the real part of the complex refractive index from 1 and $\beta$ denotes the imaginary part of the complex refractive index of the material.

29. The apparatus of claim 17 in which the means for ascertaining the diffraction-based repair shape for the at least one defect is configured to determine an imaging structure that comprises a Fresnel zone plate.

30. The apparatus of claim 17 in which the means for ascertaining the diffraction-based repair shape for the at least one defect is configured to determine a change of a part of an absorber pattern that is adjacent to the at least one defect for the purposes of at least partly correcting an amplitude disturbance caused by the at least one defect.

* * * * *

UNITED STATES PATENT AND TRADEMARK OFFICE
CERTIFICATE OF CORRECTION

| | | |
|---|---|---|
| PATENT NO. | : 11,079,673 B2 | Page 1 of 1 |
| APPLICATION NO. | : 15/941709 | |
| DATED | : August 3, 2021 | |
| INVENTOR(S) | : Hendrik Steigerwald and Renzo Capelli | |

It is certified that error appears in the above-identified patent and that said Letters Patent is hereby corrected as shown below:

In the Specification

Column 8
Line 36, delete "AIMS" and insert -- AIMS™ --

Column 9
Line 53, delete "ZERODUIR®," and insert -- ZERODUR®, --

Column 12
Line 18, delete "phase change of 7C" and insert -- phase change of π --

Signed and Sealed this
Eighteenth Day of January, 2022

Drew Hirshfeld
*Performing the Functions and Duties of the
Under Secretary of Commerce for Intellectual Property and
Director of the United States Patent and Trademark Office*